(12) United States Patent
Biberger

(10) Patent No.: US 8,668,803 B1
(45) Date of Patent: Mar. 11, 2014

(54) SANDWICH OF IMPACT RESISTANT MATERIAL

(75) Inventor: Maximilian A. Biberger, Scottsdale, AZ (US)

(73) Assignee: SDCmaterials, Inc., Tempe, AZ (US)

( * ) Notice: Subject to any disclaimer, the term of this patent is extended or adjusted under 35 U.S.C. 154(b) by 329 days.

(21) Appl. No.: 12/968,235

(22) Filed: Dec. 14, 2010

Related U.S. Application Data

(60) Provisional application No. 61/284,329, filed on Dec. 15, 2009.

(51) Int. Cl.
| | |
|---|---|
| B29C 65/02 | (2006.01) |
| B29C 65/48 | (2006.01) |
| B29C 67/04 | (2006.01) |
| F41H 5/04 | (2006.01) |

(52) U.S. Cl.
USPC .................. 156/306.6; 156/62.2; 156/274.4; 264/113; 264/125; 264/434; 428/217; 428/911; 89/36.02

(58) Field of Classification Search
USPC .......... 156/62.2, 274.4, 306.6; 264/112, 113, 264/125, 434; 428/217, 911; 89/36.02
See application file for complete search history.

(56) References Cited

U.S. PATENT DOCUMENTS

| | | | |
|---|---|---|---|
| 2,284,554 A | 5/1942 | Beyerstedt | |
| 2,419,042 A | 4/1947 | Todd | |
| 2,519,531 A | 8/1950 | Worn | |
| 2,562,753 A | 7/1951 | Trost | |
| 2,689,780 A | 9/1954 | Rice | |
| 3,001,402 A | 9/1961 | Koblin | |
| 3,042,511 A | 7/1962 | Reding, Jr. | |
| 3,067,025 A | 12/1962 | Chisholm | |
| 3,145,287 A | 8/1964 | Siebein et al. | |
| 3,178,121 A | 4/1965 | Wallace, Jr. | |
| 3,179,782 A | 4/1965 | Matvay | |
| 3,181,947 A | 5/1965 | Vordahl | |

(Continued)

FOREIGN PATENT DOCUMENTS

| | | |
|---|---|---|
| EP | 1 134 302 A1 | 9/2001 |
| EP | 1 619 168 A1 | 1/2006 |

(Continued)

OTHER PUBLICATIONS

A. Gutsch et al., "Gas-Phase Production of Nanoparticles", Kona No. 20, 2002, pp. 24-37.

(Continued)

*Primary Examiner* — Michael Tolin
(74) *Attorney, Agent, or Firm* — Morrison & Foerster LLP

(57) ABSTRACT

A sandwich of impact resistant material comprising: a first tile comprising a plurality of nano-particles bonded together, wherein the nano-structure of the nano-particles is present in the first tile and the first tile comprises a hardness value; a second tile comprising a plurality of nano-particles bonded together, wherein the nano-structure of the nano-particles is present in the second tile and the second tile comprises a hardness value; and a third tile comprising a plurality of nano-particles bonded together, wherein the nano-structure of the nano-particles is present in the third tile and the third tile comprises a hardness value, wherein the second tile is coupled in between the first tile and the third tile, and the second tile comprises a hardness value greater than the first tile and the second tile.

14 Claims, 6 Drawing Sheets

(56) References Cited

U.S. PATENT DOCUMENTS

| | | | |
|---|---|---|---|
| 3,313,908 A | 4/1967 | Unger et al. |
| 3,401,465 A | 9/1968 | Larwill |
| 3,450,926 A | 6/1969 | Kiernan |
| 3,457,788 A | 7/1969 | Nobuo Miyajima |
| 3,537,513 A | 11/1970 | Austin |
| 3,552,653 A | 1/1971 | Inoue |
| 3,617,358 A | 11/1971 | Dittrich |
| 3,667,111 A | 6/1972 | Chartet |
| 3,741,001 A | 6/1973 | Fletcher et al. |
| 3,752,172 A | 8/1973 | Cohen et al. |
| 3,761,360 A | 9/1973 | Auvil et al. |
| 3,774,442 A | 11/1973 | Gustavsson |
| 3,804,034 A * | 4/1974 | Stiglich, Jr. .................. 428/547 |
| 3,830,756 A | 8/1974 | Sanchez et al. |
| 3,871,448 A | 3/1975 | Vann et al. |
| 3,892,882 A | 7/1975 | Guest et al. |
| 3,914,573 A | 10/1975 | Muehlberger |
| 3,959,094 A | 5/1976 | Steinberg |
| 3,959,420 A | 5/1976 | Geddes et al. |
| 3,969,482 A | 7/1976 | Teller |
| 4,008,620 A | 2/1977 | Narato et al. |
| 4,018,388 A | 4/1977 | Andrews |
| 4,021,021 A | 5/1977 | Hall et al. |
| 4,127,760 A | 11/1978 | Meyer et al. |
| 4,139,497 A | 2/1979 | Castor et al. |
| 4,157,316 A | 6/1979 | Thompson et al. |
| 4,171,288 A | 10/1979 | Keith et al. |
| 4,174,298 A | 11/1979 | Antos |
| 4,189,925 A | 2/1980 | Long |
| 4,227,928 A | 10/1980 | Wang |
| 4,248,387 A | 2/1981 | Andrews |
| 4,253,917 A | 3/1981 | Wang |
| 4,260,649 A | 4/1981 | Dension et al. |
| 4,284,609 A | 8/1981 | deVries |
| 4,315,874 A | 2/1982 | Ushida et al. |
| 4,344,779 A | 8/1982 | Isserlis |
| 4,369,167 A | 1/1983 | Weir |
| 4,388,274 A | 6/1983 | Rourke et al. |
| 4,419,331 A | 12/1983 | Montalvo |
| 4,431,750 A | 2/1984 | McGinnis et al. |
| 4,436,075 A | 3/1984 | Campbell et al. |
| 4,440,733 A | 4/1984 | Lawson et al. |
| 4,458,138 A | 7/1984 | Adrian et al. |
| 4,459,327 A | 7/1984 | Wang |
| 4,505,945 A | 3/1985 | Dubust et al. |
| 4,513,149 A | 4/1985 | Gray et al. |
| 4,523,981 A | 6/1985 | Ang et al. |
| 4,545,872 A | 10/1985 | Sammells et al. |
| RE32,244 E | 9/1986 | Andersen |
| 4,609,441 A | 9/1986 | Frese, Jr. et al. |
| 4,723,589 A | 2/1988 | Iyer et al. |
| 4,731,517 A | 3/1988 | Cheney |
| 4,764,283 A | 8/1988 | Ashbrook et al. |
| 4,765,805 A | 8/1988 | Wahl et al. |
| 4,824,624 A | 4/1989 | Palicka et al. |
| 4,836,084 A * | 6/1989 | Vogelesang et al. ......... 89/36.02 |
| 4,855,505 A | 8/1989 | Koll |
| 4,866,240 A | 9/1989 | Webber |
| 4,885,038 A | 12/1989 | Anderson et al. |
| 4,921,586 A | 5/1990 | Molter |
| 4,983,555 A | 1/1991 | Roy et al. |
| 4,987,033 A | 1/1991 | Abkowitz et al. |
| 5,006,163 A | 4/1991 | Benn et al. |
| 5,015,863 A | 5/1991 | Takeshima et al. |
| 5,041,713 A | 8/1991 | Weidman |
| 5,043,548 A | 8/1991 | Whitney et al. |
| 5,070,064 A | 12/1991 | Hsu et al. |
| 5,073,193 A | 12/1991 | Chaklader et al. |
| 5,133,190 A | 7/1992 | Abdelmalek |
| 5,151,296 A | 9/1992 | Tokunaga |
| 5,157,007 A | 10/1992 | Domesle et al. |
| 5,192,130 A | 3/1993 | Endo et al. |
| 5,230,844 A | 7/1993 | Macaire et al. |
| 5,233,153 A | 8/1993 | Coats |
| 5,269,848 A | 12/1993 | Nakagawa |
| 5,330,945 A | 7/1994 | Beckmeyer et al. |
| 5,338,716 A | 8/1994 | Triplett et al. |
| 5,369,241 A | 11/1994 | Taylor et al. |
| 5,371,049 A | 12/1994 | Moffett et al. |
| 5,372,629 A | 12/1994 | Anderson et al. |
| 5,392,797 A | 2/1995 | Welch |
| 5,436,080 A | 7/1995 | Inoue et al. |
| 5,439,865 A | 8/1995 | Abe et al. |
| 5,442,153 A | 8/1995 | Marantz et al. |
| 5,460,701 A | 10/1995 | Parker et al. |
| 5,464,458 A | 11/1995 | Yamamoto |
| 5,485,941 A | 1/1996 | Guyomard et al. |
| 5,534,149 A | 7/1996 | Birkenbeil et al. |
| 5,534,270 A | 7/1996 | De Castro |
| 5,543,173 A | 8/1996 | Horn, Jr. et al. |
| 5,553,507 A | 9/1996 | Basch et al. |
| 5,562,966 A | 10/1996 | Clarke et al. |
| 5,582,807 A | 12/1996 | Liao et al. |
| 5,611,896 A | 3/1997 | Swanepoel et al. |
| 5,630,322 A | 5/1997 | Heilmann et al. |
| 5,652,304 A | 7/1997 | Calderon et al. |
| 5,714,644 A | 2/1998 | Irgang et al. |
| 5,723,187 A | 3/1998 | Popoola et al. |
| 5,726,414 A | 3/1998 | Kitahashi et al. |
| 5,749,938 A | 5/1998 | Coombs |
| 5,776,359 A | 7/1998 | Schultz et al. |
| 5,788,738 A | 8/1998 | Pirzada et al. |
| 5,804,155 A | 9/1998 | Farrauto et al. |
| 5,811,187 A | 9/1998 | Anderson et al. |
| 5,837,959 A | 11/1998 | Muehlberger et al. |
| 5,851,507 A | 12/1998 | Pirzada et al. |
| 5,853,815 A | 12/1998 | Muehlberger |
| 5,858,470 A | 1/1999 | Bernecki et al. |
| 5,884,473 A | 3/1999 | Noda et al. |
| 5,905,000 A | 5/1999 | Yadav et al. |
| 5,928,806 A | 7/1999 | Olah et al. |
| 5,935,293 A | 8/1999 | Detering et al. |
| 5,973,289 A | 10/1999 | Read et al. |
| 5,989,648 A | 11/1999 | Phillips |
| 5,993,967 A | 11/1999 | Brotzman, Jr. et al. |
| 5,993,988 A | 11/1999 | Ohara et al. |
| 6,004,620 A | 12/1999 | Camm |
| 6,012,647 A | 1/2000 | Ruta et al. |
| 6,033,781 A | 3/2000 | Brotzman, Jr. et al. |
| 6,045,765 A | 4/2000 | Nakatsuji et al. |
| 6,059,853 A | 5/2000 | Coombs |
| 6,066,587 A | 5/2000 | Kurokawa et al. |
| 6,084,197 A | 7/2000 | Fusaro, Jr. |
| 6,093,306 A | 7/2000 | Hanrahan et al. |
| 6,093,378 A | 7/2000 | Deeba et al. |
| 6,102,106 A | 8/2000 | Manning et al. |
| 6,117,376 A | 9/2000 | Merkel |
| 6,168,694 B1 | 1/2001 | Huang et al. |
| 6,190,627 B1 | 2/2001 | Hoke et al. |
| 6,213,049 B1 | 4/2001 | Yang |
| 6,214,195 B1 | 4/2001 | Yadav et al. |
| 6,228,904 B1 | 5/2001 | Yadav et al. |
| 6,254,940 B1 | 7/2001 | Pratsinis et al. |
| 6,261,484 B1 | 7/2001 | Phillips et al. |
| 6,267,864 B1 | 7/2001 | Yadav et al. |
| 6,322,756 B1 | 11/2001 | Arno et al. |
| 6,342,465 B1 | 1/2002 | Klein et al. |
| 6,344,271 B1 | 2/2002 | Yadav et al. |
| 6,362,449 B1 | 3/2002 | Hadidi et al. |
| 6,379,419 B1 | 4/2002 | Celik et al. |
| 6,387,560 B1 | 5/2002 | Yadav et al. |
| 6,395,214 B1 | 5/2002 | Kear et al. |
| 6,398,843 B1 | 6/2002 | Tarrant |
| 6,409,851 B1 | 6/2002 | Sethuram et al. |
| 6,413,781 B1 | 7/2002 | Geis et al. |
| 6,416,818 B1 | 7/2002 | Aikens et al. |
| RE37,853 E | 9/2002 | Detering et al. |
| 6,444,009 B1 | 9/2002 | Liu et al. |
| 6,475,951 B1 | 11/2002 | Domesle et al. |
| 6,488,904 B1 | 12/2002 | Cox et al. |
| 6,506,995 B1 | 1/2003 | Fusaro, Jr. et al. |
| 6,517,800 B1 | 2/2003 | Cheng et al. |
| 6,524,662 B2 | 2/2003 | Jang et al. |
| 6,531,704 B2 | 3/2003 | Yadav et al. |

(56) References Cited

U.S. PATENT DOCUMENTS

| | | |
|---|---|---|
| 6,548,445 B1 | 4/2003 | Buysch et al. |
| 6,554,609 B2 | 4/2003 | Yadav et al. |
| 6,562,304 B1 | 5/2003 | Mizrahi |
| 6,562,495 B2 | 5/2003 | Yadav et al. |
| 6,569,393 B1 | 5/2003 | Hoke et al. |
| 6,569,397 B1 | 5/2003 | Yadav et al. |
| 6,569,518 B2 | 5/2003 | Yadav et al. |
| 6,572,672 B2 | 6/2003 | Yadav et al. |
| 6,579,446 B1 | 6/2003 | Teran et al. |
| 6,596,187 B2 | 7/2003 | Coll et al. |
| 6,603,038 B1 | 8/2003 | Hagemeyer et al. |
| 6,607,821 B2 | 8/2003 | Yadav et al. |
| 6,610,355 B2 | 8/2003 | Yadav et al. |
| 6,623,559 B2 | 9/2003 | Huang |
| 6,635,357 B2 | 10/2003 | Moxson et al. |
| 6,641,775 B2 | 11/2003 | Vigliotti et al. |
| 6,652,822 B2 | 11/2003 | Phillips et al. |
| 6,652,967 B2 | 11/2003 | Yadav et al. |
| 6,669,823 B1 | 12/2003 | Sarkas et al. |
| 6,682,002 B2 | 1/2004 | Kyotani |
| 6,689,192 B1 | 2/2004 | Phillips et al. |
| 6,699,398 B1 | 3/2004 | Kim |
| 6,706,097 B2 | 3/2004 | Zornes |
| 6,706,660 B2 | 3/2004 | Park |
| 6,710,207 B2 | 3/2004 | Bogan, Jr. et al. |
| 6,713,176 B2 | 3/2004 | Yadav et al. |
| 6,716,525 B1 | 4/2004 | Yadav et al. |
| 6,744,006 B2 | 6/2004 | Johnson et al. |
| 6,746,791 B2 | 6/2004 | Yadav et al. |
| 6,772,584 B2 | 8/2004 | Chun et al. |
| 6,786,950 B2 | 9/2004 | Yadav et al. |
| 6,813,931 B2 | 11/2004 | Yadav et al. |
| 6,817,388 B2 | 11/2004 | Tsangaris et al. |
| 6,832,735 B2 | 12/2004 | Yadav et al. |
| 6,838,072 B1 | 1/2005 | Kong et al. |
| 6,841,509 B1 | 1/2005 | Hwang et al. |
| 6,855,410 B2 | 2/2005 | Buckley |
| 6,855,426 B2 | 2/2005 | Yadav |
| 6,855,749 B1 | 2/2005 | Yadav et al. |
| 6,858,170 B2 | 2/2005 | Van Thillo et al. |
| 6,886,545 B1 | 5/2005 | Holm |
| 6,896,958 B1 | 5/2005 | Cayton et al. |
| 6,902,699 B2 | 6/2005 | Fritzemeier et al. |
| 6,916,872 B2 | 7/2005 | Yadav et al. |
| 6,919,065 B2 | 7/2005 | Zhou et al. |
| 6,919,527 B2 | 7/2005 | Boulos et al. |
| 6,933,331 B2 | 8/2005 | Yadav et al. |
| 6,972,115 B1 | 12/2005 | Ballard |
| 6,986,877 B2 | 1/2006 | Takikawa et al. |
| 6,994,837 B2 | 2/2006 | Boulos et al. |
| 7,007,872 B2 | 3/2006 | Yadav et al. |
| 7,022,305 B2 | 4/2006 | Drumm et al. |
| 7,052,777 B2 | 5/2006 | Brotzman, Jr. et al. |
| 7,073,559 B2 | 7/2006 | O'Larey et al. |
| 7,081,267 B2 | 7/2006 | Yadav |
| 7,101,819 B2 | 9/2006 | Rosenflanz et al. |
| 7,147,544 B2 | 12/2006 | Rosenflanz |
| 7,147,894 B2 | 12/2006 | Zhou et al. |
| 7,166,198 B2 | 1/2007 | Van Der Walt et al. |
| 7,166,663 B2 | 1/2007 | Cayton et al. |
| 7,172,649 B2 | 2/2007 | Conrad et al. |
| 7,172,790 B2 | 2/2007 | Koulik et al. |
| 7,178,747 B2 | 2/2007 | Yadav et al. |
| 7,208,126 B2 | 4/2007 | Musick et al. |
| 7,211,236 B2 | 5/2007 | Stark et al. |
| 7,217,407 B2 | 5/2007 | Zhang |
| 7,220,398 B2 | 5/2007 | Sutorik et al. |
| 7,255,498 B2 | 8/2007 | Bush et al. |
| 7,265,076 B2 | 9/2007 | Taguchi et al. |
| 7,307,195 B2 | 12/2007 | Polverejan et al. |
| 7,323,655 B2 | 1/2008 | Kim |
| 7,384,447 B2 | 6/2008 | Kodas et al. |
| 7,402,899 B1 | 7/2008 | Whiting et al. |
| 7,417,008 B2 | 8/2008 | Richards et al. |
| 7,494,527 B2 | 2/2009 | Jurewicz et al. |
| 7,517,826 B2 | 4/2009 | Fujdala et al. |
| 7,534,738 B2 | 5/2009 | Fujdala et al. |
| 7,541,012 B2 | 6/2009 | Yeung et al. |
| 7,541,310 B2 | 6/2009 | Espinoza et al. |
| 7,557,324 B2 | 7/2009 | Nylen et al. |
| 7,572,315 B2 | 8/2009 | Boulos et al. |
| 7,576,029 B2 | 8/2009 | Saito et al. |
| 7,576,031 B2 | 8/2009 | Beutel et al. |
| 7,604,843 B1 | 10/2009 | Robinson et al. |
| 7,611,686 B2 | 11/2009 | Alekseeva et al. |
| 7,615,097 B2 | 11/2009 | McKechnie et al. |
| 7,618,919 B2 | 11/2009 | Shimazu et al. |
| 7,622,693 B2 | 11/2009 | Foret |
| 7,632,775 B2 | 12/2009 | Zhou et al. |
| 7,635,218 B1 | 12/2009 | Lott |
| 7,674,744 B2 | 3/2010 | Shiratori et al. |
| 7,678,419 B2 | 3/2010 | Kevwitch et al. |
| 7,704,369 B2 | 4/2010 | Olah et al. |
| 7,709,411 B2 | 5/2010 | Zhou et al. |
| 7,709,414 B2 | 5/2010 | Fujdala et al. |
| 7,745,367 B2 | 6/2010 | Fujdala et al. |
| 7,750,265 B2 | 7/2010 | Belashchenko et al. |
| 7,803,210 B2 | 9/2010 | Sekine et al. |
| 7,851,405 B2 | 12/2010 | Wakamatsu et al. |
| 7,874,239 B2 | 1/2011 | Howland |
| 7,875,573 B2 | 1/2011 | Beutel et al. |
| 7,897,127 B2 | 3/2011 | Layman et al. |
| 7,902,104 B2 | 3/2011 | Kalck |
| 7,905,942 B1 | 3/2011 | Layman |
| 7,935,655 B2 | 5/2011 | Tolmachev |
| 8,051,724 B1 | 11/2011 | Layman et al. |
| 8,076,258 B1 | 12/2011 | Biberger |
| 8,080,494 B2 | 12/2011 | Yasuda et al. |
| 8,089,495 B2 | 1/2012 | Keller |
| 8,142,619 B2 | 3/2012 | Layman et al. |
| 8,168,561 B2 | 5/2012 | Virkar |
| 8,173,572 B2 | 5/2012 | Feaviour |
| 8,211,392 B2 | 7/2012 | Grubert et al. |
| 8,258,070 B2 | 9/2012 | Fujdala et al. |
| 8,278,240 B2 | 10/2012 | Tange et al. |
| 8,294,060 B2 | 10/2012 | Mohanty et al. |
| 8,309,489 B2 | 11/2012 | Roldan Cuenya et al. |
| 8,349,761 B2 | 1/2013 | Xia et al. |
| 2001/0004009 A1 | 6/2001 | MacKelvie |
| 2001/0042802 A1 | 11/2001 | Youds |
| 2001/0055554 A1 | 12/2001 | Hoke et al. |
| 2002/0018815 A1 | 2/2002 | Sievers et al. |
| 2002/0068026 A1 | 6/2002 | Murrell et al. |
| 2002/0071800 A1 | 6/2002 | Hoke et al. |
| 2002/0079620 A1 | 6/2002 | Dubuis et al. |
| 2002/0100751 A1 | 8/2002 | Carr |
| 2002/0102674 A1 | 8/2002 | Anderson |
| 2002/0131914 A1 | 9/2002 | Sung |
| 2002/0143417 A1 | 10/2002 | Ito et al. |
| 2002/0182735 A1 | 12/2002 | Kibby et al. |
| 2002/0183191 A1 | 12/2002 | Faber et al. |
| 2002/0192129 A1 | 12/2002 | Shamouilian et al. |
| 2003/0036786 A1 | 2/2003 | Duren et al. |
| 2003/0042232 A1 | 3/2003 | Shimazu |
| 2003/0047617 A1 | 3/2003 | Shanmugham et al. |
| 2003/0066800 A1 | 4/2003 | Saim et al. |
| 2003/0108459 A1 | 6/2003 | Wu et al. |
| 2003/0110931 A1 | 6/2003 | Aghajanian et al. |
| 2003/0129098 A1 | 7/2003 | Endo et al. |
| 2003/0139288 A1 | 7/2003 | Cai et al. |
| 2003/0143153 A1 | 7/2003 | Boulos et al. |
| 2003/0172772 A1 | 9/2003 | Sethuram et al. |
| 2003/0223546 A1 | 12/2003 | McGregor et al. |
| 2004/0009118 A1 | 1/2004 | Phillips et al. |
| 2004/0023302 A1 | 2/2004 | Archibald et al. |
| 2004/0023453 A1 | 2/2004 | Xu et al. |
| 2004/0077494 A1 | 4/2004 | LaBarge et al. |
| 2004/0103751 A1 | 6/2004 | Joseph et al. |
| 2004/0109523 A1 | 6/2004 | Singh et al. |
| 2004/0119064 A1 | 6/2004 | Narayan et al. |
| 2004/0127586 A1 | 7/2004 | Jin et al. |
| 2004/0166036 A1 | 8/2004 | Chen et al. |
| 2004/0167009 A1 | 8/2004 | Kuntz et al. |
| 2004/0176246 A1 | 9/2004 | Shirk et al. |

(56) References Cited

U.S. PATENT DOCUMENTS

| | | |
|---|---|---|
| 2004/0208805 A1 | 10/2004 | Fincke et al. |
| 2004/0213998 A1 | 10/2004 | Hearley et al. |
| 2004/0238345 A1 | 12/2004 | Koulik et al. |
| 2004/0251017 A1 | 12/2004 | Pillion et al. |
| 2004/0251241 A1 | 12/2004 | Blutke et al. |
| 2005/0000321 A1 | 1/2005 | O'Larey et al. |
| 2005/0000950 A1 | 1/2005 | Schroder et al. |
| 2005/0066805 A1 | 3/2005 | Park et al. |
| 2005/0070431 A1 | 3/2005 | Alvin et al. |
| 2005/0077034 A1 | 4/2005 | King |
| 2005/0097988 A1 | 5/2005 | Kodas et al. |
| 2005/0106865 A1 | 5/2005 | Chung et al. |
| 2005/0133121 A1 | 6/2005 | Subramanian et al. |
| 2005/0163673 A1 | 7/2005 | Johnson et al. |
| 2005/0199739 A1 | 9/2005 | Kuroda et al. |
| 2005/0220695 A1 | 10/2005 | Abatzoglou et al. |
| 2005/0227864 A1 | 10/2005 | Sutorik et al. |
| 2005/0233380 A1 | 10/2005 | Persiri et al. |
| 2005/0240069 A1 | 10/2005 | Polverejan et al. |
| 2005/0258766 A1 | 11/2005 | Kim |
| 2005/0275143 A1 | 12/2005 | Toth |
| 2006/0051505 A1 | 3/2006 | Kortshagen et al. |
| 2006/0068989 A1 | 3/2006 | Ninomiya et al. |
| 2006/0094595 A1 | 5/2006 | Labarge |
| 2006/0096393 A1 | 5/2006 | Pesiri |
| 2006/0105910 A1 | 5/2006 | Zhou et al. |
| 2006/0108332 A1 | 5/2006 | Belashchenko |
| 2006/0153728 A1 | 7/2006 | Schoenung et al. |
| 2006/0153765 A1 | 7/2006 | Pham-Huu et al. |
| 2006/0159596 A1 | 7/2006 | De La Veaux et al. |
| 2006/0166809 A1 | 7/2006 | Malek et al. |
| 2006/0211569 A1 | 9/2006 | Dang et al. |
| 2006/0213326 A1 | 9/2006 | Gollob et al. |
| 2006/0222780 A1 | 10/2006 | Gurevich et al. |
| 2006/0231525 A1 | 10/2006 | Asakawa et al. |
| 2007/0048206 A1 | 3/2007 | Hung et al. |
| 2007/0049484 A1 | 3/2007 | Kear et al. |
| 2007/0063364 A1 | 3/2007 | Hsiao et al. |
| 2007/0084308 A1 | 4/2007 | Nakamura et al. |
| 2007/0084834 A1 | 4/2007 | Hanus et al. |
| 2007/0087934 A1 | 4/2007 | Martens et al. |
| 2007/0163385 A1 | 7/2007 | Takahashi et al. |
| 2007/0173403 A1 | 7/2007 | Koike et al. |
| 2007/0178673 A1 | 8/2007 | Gole et al. |
| 2007/0221404 A1 | 9/2007 | Das et al. |
| 2007/0253874 A1 | 11/2007 | Foret |
| 2007/0292321 A1 | 12/2007 | Plischke et al. |
| 2008/0006954 A1 | 1/2008 | Yubuta et al. |
| 2008/0026041 A1 | 1/2008 | Tepper et al. |
| 2008/0031806 A1 | 2/2008 | Gavenonis et al. |
| 2008/0038578 A1 | 2/2008 | Li |
| 2008/0045405 A1 | 2/2008 | Beutel et al. |
| 2008/0047261 A1 | 2/2008 | Han et al. |
| 2008/0057212 A1 | 3/2008 | Dorier et al. |
| 2008/0064769 A1 | 3/2008 | Sato et al. |
| 2008/0105083 A1 | 5/2008 | Nakamura et al. |
| 2008/0116178 A1 | 5/2008 | Weidman |
| 2008/0125308 A1 | 5/2008 | Fujdala et al. |
| 2008/0125313 A1 | 5/2008 | Fujdala et al. |
| 2008/0138651 A1 | 6/2008 | Doi et al. |
| 2008/0175936 A1 | 7/2008 | Tokita et al. |
| 2008/0187714 A1 | 8/2008 | Wakamatsu et al. |
| 2008/0206562 A1 | 8/2008 | Stucky et al. |
| 2008/0207858 A1 | 8/2008 | Kowaleski et al. |
| 2008/0248704 A1 | 10/2008 | Mathis et al. |
| 2008/0274344 A1 | 11/2008 | Vieth et al. |
| 2008/0277092 A1 | 11/2008 | Layman et al. |
| 2008/0277264 A1 | 11/2008 | Sprague |
| 2008/0277266 A1 | 11/2008 | Layman et al. |
| 2008/0277267 A1 | 11/2008 | Biberger et al. |
| 2008/0277268 A1 | 11/2008 | Layman |
| 2008/0277269 A1 | 11/2008 | Layman et al. |
| 2008/0277270 A1 | 11/2008 | Biberger et al. |
| 2008/0277271 A1 | 11/2008 | Layman |
| 2008/0280049 A1 | 11/2008 | Kevwitch et al. |
| 2008/0280751 A1 | 11/2008 | Harutyunyan et al. |
| 2008/0280756 A1 | 11/2008 | Biberger |
| 2008/0283411 A1 | 11/2008 | Eastman et al. |
| 2008/0283498 A1 | 11/2008 | Yamazaki |
| 2009/0010801 A1 | 1/2009 | Murphy et al. |
| 2009/0054230 A1 | 2/2009 | Veeraraghavan et al. |
| 2009/0088585 A1 | 4/2009 | Schammel et al. |
| 2009/0092887 A1 | 4/2009 | McGrath et al. |
| 2009/0098402 A1 | 4/2009 | Kang et al. |
| 2009/0114568 A1 | 5/2009 | Trevino et al. |
| 2009/0162991 A1 | 6/2009 | Beneyton et al. |
| 2009/0168506 A1 | 7/2009 | Han et al. |
| 2009/0170242 A1 | 7/2009 | Lin et al. |
| 2009/0181474 A1 | 7/2009 | Nagai |
| 2009/0200180 A1 | 8/2009 | Capote et al. |
| 2009/0208367 A1 | 8/2009 | Calio et al. |
| 2009/0209408 A1 | 8/2009 | Kitamura et al. |
| 2009/0223410 A1 | 9/2009 | Jun et al. |
| 2009/0253037 A1 | 10/2009 | Park et al. |
| 2009/0274903 A1 | 11/2009 | Addiego |
| 2009/0286899 A1 | 11/2009 | Hofmann et al. |
| 2009/0324468 A1 | 12/2009 | Golden et al. |
| 2010/0089002 A1 | 4/2010 | Merkel |
| 2010/0092358 A1 | 4/2010 | Koegel et al. |
| 2010/0124514 A1 | 5/2010 | Chelluri et al. |
| 2010/0166629 A1 | 7/2010 | Deeba |
| 2010/0180581 A1 | 7/2010 | Grubert et al. |
| 2010/0180582 A1 | 7/2010 | Mueller-Stach et al. |
| 2010/0186375 A1 | 7/2010 | Kazi et al. |
| 2010/0240525 A1 | 9/2010 | Golden et al. |
| 2010/0275781 A1 | 11/2010 | Tsangaris |
| 2011/0006463 A1 | 1/2011 | Layman |
| 2011/0052467 A1 | 3/2011 | Chase et al. |
| 2011/0143041 A1 | 6/2011 | Layman et al. |
| 2011/0143915 A1 | 6/2011 | Yin et al. |
| 2011/0143916 A1 | 6/2011 | Leamon |
| 2011/0143926 A1 | 6/2011 | Yin et al. |
| 2011/0143930 A1 | 6/2011 | Yin et al. |
| 2011/0143933 A1 | 6/2011 | Yin et al. |
| 2011/0144382 A1 | 6/2011 | Yin et al. |
| 2011/0152550 A1 | 6/2011 | Grey et al. |
| 2011/0158871 A1 | 6/2011 | Arnold et al. |
| 2011/0174604 A1 | 7/2011 | Duesel et al. |
| 2011/0243808 A1 | 10/2011 | Fossey et al. |
| 2011/0245073 A1 | 10/2011 | Oljaca et al. |
| 2011/0247336 A9 | 10/2011 | Farsad et al. |
| 2011/0305612 A1 | 12/2011 | Müller-Stach et al. |
| 2012/0023909 A1 | 2/2012 | Lambert et al. |
| 2012/0045373 A1 | 2/2012 | Biberger |
| 2012/0097033 A1 | 4/2012 | Arnold et al. |
| 2012/0122660 A1 | 5/2012 | Andersen et al. |
| 2012/0124974 A1 | 5/2012 | Li et al. |
| 2012/0171098 A1 | 7/2012 | Hung et al. |
| 2012/0308467 A1 | 12/2012 | Carpenter et al. |
| 2013/0213018 A1 | 8/2013 | Yin et al. |

FOREIGN PATENT DOCUMENTS

| | | |
|---|---|---|
| GB | 1 307 941 A | 2/1973 |
| JP | 56-146804 | 11/1981 |
| JP | 61-086815 A | 5/1986 |
| JP | 63-214342 A | 9/1988 |
| JP | 1-164795 A | 6/1989 |
| JP | 05-228361 A | 9/1993 |
| JP | 05-324094 A | 12/1993 |
| JP | 6-93309 A | 4/1994 |
| JP | 6-135797 A | 5/1994 |
| JP | 6-272012 A | 9/1994 |
| JP | H6-065772 U | 9/1994 |
| JP | 7031873 A | 2/1995 |
| JP | 07-256116 A | 10/1995 |
| JP | 11-502760 A | 3/1999 |
| JP | 2000-220978 A | 8/2000 |
| JP | 2002-336688 A | 11/2002 |
| JP | 2004-233007 A | 8/2004 |
| JP | 2004-249206 A | 9/2004 |
| JP | 2004-290730 A | 10/2004 |
| JP | 2005-503250 A | 2/2005 |
| JP | 2005-122621 A | 5/2005 |

(56) References Cited

FOREIGN PATENT DOCUMENTS

| | | |
|---|---|---|
| JP | 2005-218937 A | 8/2005 |
| JP | 2005-342615 A | 12/2005 |
| JP | 2006-001779 A | 1/2006 |
| JP | 2006-508885 A | 3/2006 |
| JP | 2006-247446 A | 9/2006 |
| JP | 2006-260385 A | 9/2006 |
| JP | 2007-46162 A | 2/2007 |
| JP | 2007-203129 A | 8/2007 |
| SU | 493241 | 3/1976 |
| TW | 200611449 | 4/2006 |
| TW | 201023207 | 6/2010 |
| WO | WO-96/28577 A1 | 9/1996 |
| WO | WO 02/092503 A1 | 11/2002 |
| WO | WO 2004/052778 A2 | 6/2004 |
| WO | WO-2005/063390 A1 | 7/2005 |
| WO | WO 2006/079213 A1 | 8/2006 |
| WO | WO-2008/130451 A2 | 10/2008 |
| WO | WO-2008/130451 A3 | 10/2008 |
| WO | WO-2011/081833 A1 | 7/2011 |

OTHER PUBLICATIONS

Dr. Heike Mühlenweg et al., "Gas-Phase Reactions—Open Up New Roads to Nanoproducts", Degussa ScienceNewsletter No. 08, 2004, pp. 12-16.

Coating Generation: Vaporization of Particles in Plasma Spraying and Splat Formation, M. Vardelle, A. Vardelle, K-I li, P. Fauchais, Universite de Limoges, 123 Avenue A. Thomas 87000, Limoges, F. , Pure & Chem, vol. 68, No. 5, pp. 1093-1099, 1996.

H. Konrad et al., "Nanostructured Cu-Bi Alloys Prepared by Co-Evaporation in a Continuous Gas Flow," NanoStructured Materials, vol. 7, No. 6, 1996, pp. 605-610.

Kenvin et al. "Supported Catalysts Prepared from Mononuclear Copper Complexes: Catalytic Properties", Journal of Catalysis, pp. 81-91, (1992).

J. Heberlein, "New Approaches in Thermal Plasma Technology", Pure Appl. Chem., vol. 74, No. 3, 2002, pp. 327-335.

M. Vardelle et al., "Experimental Investigation of Powder Vaporization in Thermal Plasma Jets," Plasma Chemistry and Plasma Processing, vol. 11, No. 2, Jun. 1991, pp. 185-201.

National Aeronautics and Space Administration, "Enthalpy", http://www.grc.nasa.gov/WWW/K-12/airplane/enthalpy.html, Nov. 23, 2009, 1 page.

P. Fauchais et al., "Plasma Spray: Study of the Coating Generation," Ceramics International, Elsevier, Amsterdam, NL, vol. 22, No. 4, Jan. 1996, pp. 295-303.

P. Fauchais et al., "Les Dépôts Par Plasma Thermique," Revue Generale De L'Electricitie, RGE. Paris, FR, No. 2, Jan. 1993, pp. 7-12.

P. Fauchais et al, "La Projection Par Plasma: Une Revue," Annales De Physique, vol. 14, No. 3, Jun. 1989, pp. 261-310.

T. Yoshida, "The Future of Thermal Plasma Processing for Coating", Pure & Appl. Chem., vol. 66, No. 6, 1994 pp. 1223-1230.

Han et al., Deformation Mechanisms and Ductility of Nanostructured Al Alloys, Mat. Res. Soc. Symp. Proc. vol. 821, Jan. 2004, Material Research Society, http://www.mrs.org/s_mrs/bin.asp?CID=2670 &DOC=FILE.PDF., 6 pages.

Nagai, Yasutaka, et al., "Sintering Inhibition Mechanism of Platinum Supported on Ceria-based Oxide and Pt-oxide-support Interaction," Journal of Catalysis 242 (2006), pp. 103-109, Jul. 3, 2006, Elsevier.

Derwent English Abstract for publication No. SU 193241 A, Application No. 1973SU1943286 filed on Jul. 2, 1973, published on Mar. 1, 1976, entitled "Catalyst for Ammonia Synthesis Contains Oxides of Aluminium, Potassium, Calcium, Iron and Nickel Oxide for Increased Activity," 3 pgs.

Babin, A. et al. (1985). "Solvents Used in the Arts," *Center for Safety in the Arts:* 16 pages.

Bateman, J. E. et al. (Dec. 17, 1998). "Alkylation of Porous Silicon by Direct Reaction with Alkenes and Alkynes," Angew. Chem Int. Ed. 37(19):2683-2685.

Carrot, G. et al. (Sep. 17, 2002). "Surface-Initiated Ring-Opening Polymerization: A Versatile Method for Nanoparticle Ordering," Macromolecules 35(22):8400-8404.

Chen, H.-S. et al. (Jul. 3, 2001). "On the Photoluminescence of Si Nanoparticles," Mater. Phys. Mech. 4:62-66.

Chen, W.-J. et al. (Mar. 18, 2008). "Functional $Fe_3O_4/TiO_2$ Core/Shell Magnetic Nanoparticles as Photokilling Agents for Pathogenic Bacteria," *Small* 4(4): 485-491.

Faber, K. T. et al. (Sep. 1988). "Toughening by Stress-Induced Microcracking in Two-Phase Ceramics," Communications of the American Ceramic Society 71(9): C-399-C401.

Fojtik, A. et al. (Apr. 29, 1994). "Luminescent Colloidal Silicon Particles,"Chemical Physics Letters 221:363-367.

Fojtik, A. (Jan. 13, 2006). "Surface Chemistry of Luminescent Colloidal Silicon Nanoparticles," J. Phys. Chem. B. 110(5):1994-1998.

Gangeri, M. et al. (2009). "Fe and Pt Carbon Nanotubes for the Electrocatalytic Conversion of Carbon Dioxide to Oxygenates," *Catalysis Today* 143: 57-63.

Hua, F. et al. (Mar. 2006). "Organically Capped Silicon Nanoparticles With Blue Photoluminescence Prepared by Hydrosilylation Followed by Oxidation," Langmuir 22(9):4363-4370.

Ji, Y. et al. (Nov. 2002) "Processing and Mechanical Properties of Al2O3-5 vol.% Cr Nanocomposites," Journal of the European Ceramic Society 22(12):1927-1936.

Jouet, R. J. et al. (Jan. 25, 2005). "Surface Passivation of Bare Aluminum Nanoparticles Using Perfluoroalkyl Carboxylic Acids," Chem. Mater.17(11):2987-2996.

Kim, N. Y. et al. (Mar. 5, 1997). "Thermal Derivatization of Porous Silicon with Alcohols," J. Am. Chem. Soc. 119(9):2297-2298.

Kwon, Y.-S. et al. (Apr. 30, 2003). "Passivation Process for Superfine Aluminum Powders Obtained by Electrical Explosion of Wires," Applied Surface Science 211:57-67.

Langner, A. et al. (Aug. 25, 2005). "Controlled Silicon Surface Functionalization by Alkene Hydrosilylation," J. Am. Chem. Soc. 127(37):12798-12799.

Li, D. et al. (Apr. 9, 2005). "Environmentally Responsive "Hairy" Nanoparticles: Mixed Homopolymer Brushes on Silica Nanoparticles Synthesized by Living Radical Polymerization Techniques," J. Am. Chem. Soc. 127(7):6248-6256.

Li, X. et al. (May 25, 2004). "Surface Functionalization of Silicon Nanoparticles Produced by Laser-Driven Pyrolysis of Silane Followed by HF-HNO3 Etching," Langmuir 20(11):4720-4727.

Liao, Y.-C. et al. (Jun. 27, 2006). "Self-Assembly of Organic Monolayers on Aerosolized Silicon Nanoparticles," J.Am. Chem. Soc. 128(28):9061-9065.

Liu, S.-M. et al. (Jan. 13, 2006). "Enhanced Photoluminescence from Si Nano-Organosols by Functionalization With Alkenes and Their Size Evolution," Chem. Mater. 18(3):637-642.

Luo, J. et al. (2008). "Core/Shell Nanoparticles as Electrocatalysts for Fuel Cell Reactions," *Advanced Materials* 20: 4342-4347.

Mignard, D. et al. (2003). "Methanol Synthesis from Flue-Gas $CO_2$ and Renewable Electricity: A Feasibility Study," *International Journal of Hydrogen Energy* 28: 455-464.

Neiner, D. (Aug. 5, 2006). "Low-Temperature Solution Route to Macroscopic Amounts of Hydrogen Terminated Silicon Nanoparticles," J. Am. Chem. Soc. 128:11016-11017.

Netzer, L. et al. (1983). "A New Approach to Construction of Artificial Monolayer Assemblies," J. Am. Chem. Soc. 105(3):674-676.

Park, H.-Y. et al. (May 30, 2007). "Fabrication of Magnetic Core@Shell Fe Oxide@Au Nanoparticles for Interfacial Bioactivity and Bio-Separation," *Langmuir* 23: 9050-9056.

Park, N.-G. et al. (Feb. 17, 2004). "Morphological and Photoelectrochemical Characterization of Core-Shell Nanoparticle Films for Dye-Sensitized Solar Cells: Zn-O Type Shell on $SnO_2$ and $TiO_2$ Cores," *Langmuir* 20: 4246-4253.

"Plasma Spray and Wire Flame Spray Product Group," located at http://www.processmaterials.com/spray.html, published by Process Materials, Inc., last accessed Aug. 5, 2013, 2 pages.

"Platinum Group Metals: Annual Review 1996" (Oct. 1997). Engineering and Mining Journal, p. 63.

Rahaman, R. A. et al. (1995). "Synthesis of Powders," in Ceramic Processing and Sintering. Marcel Decker, Inc., New York, pp. 71-77.

(56) References Cited

OTHER PUBLICATIONS

Sailor, M. J. (1997). "Surface Chemistry of Luminescent Silicon Nanocrystallites," Adv. Mater. 9(10):783-793.
Stiles, A. B. (Jan. 1, 1987). "Manufacture of Carbon-Supported Metal Catalysts," in Catalyst Supports and Supported Catalysts, Butterworth Publishers, MA, pp. 125-132.
Subramanian, S. et al. (1991). "Structure and Activity of Composite Oxide Supported Platinum-Iridium Catalysts," Applied Catalysts 74: 65-81.
Tao, Y.-T. (May 1993). "Structural Comparison of Self-Assembled Monolayers of n-Alkanoic Acids on the surfaces of Silver, Copper, and Aluminum," J. Am. Chem. Soc. 115(10):4350-4358.
Ünal, N. et al. (Nov. 2011). "Influence of WC Particles on the Microstructural and Mechanical Properties of 3 mol% $Y_2O_3$ Stabilized $ZrO_2$ Matrix Composites Produced by Hot Pressing," Journal of the European Ceramic Society (31)13: 2267-2275.
Zou, J. et al. (Jun. 4, 2004). "Solution Synthesis of Ultrastable Luminescent Siloxane-Coated Silicon Nanoparticles," Nano Letters 4(7):1181-1186.
U.S. Appl. No. 13/291,983, filed Nov. 8, 2011, for Layman et al.
U.S. Appl. No. 12/152,084, filed May 9, 2008, for Biberger.
U.S. Appl. No. 13/028,693, filed Feb. 16, 2011, for Biberger.
U.S. Appl. No. 12/943,909, filed Nov. 10, 2010, for Layman.
U.S. Appl. No. 12/152,111, filed May 9, 2008, for Biberger et al.
U.S. Appl. No. 12/151,830, filed May 8, 2008, for Biberger et al.
U.S. Appl. No. 12/968,248, filed Dec. 14, 2010, for Biberger.
U.S. Appl. No. 12/968,245, filed Dec. 14, 2010, for Biberger.
U.S. Appl. No. 12/968,241, filed Dec. 14, 2010, for Biberger.
U.S. Appl. No. 12/968,239, filed Dec. 14, 2010, for Biberger.
U.S. Appl. No. 12/969,128, filed Dec. 15, 2010, for Biberger.
U.S. Appl. No. 12/962,463, filed Dec. 7, 2010, for Leaman.
U.S. Appl. No. 12/961,030, filed Dec. 6, 2010, for Lehman.
U.S. Appl. No. 12/961,108, filed Dec. 6, 2010, for Lehman.
U.S. Appl. No. 12/961,200, filed Dec. 6, 2010, for Lehman.
U.S. Appl. No. 12/968,253, filed Dec. 14, 2010, for Biberger.
U.S. Appl. No. 12/969,306, filed Dec. 15, 2010, for Lehman et al.
U.S. Appl. No. 12/969,447, filed Dec. 15, 2010, for Biberger et al.
U.S. Appl. No. 12/969,087, filed Dec. 15, 2010, for Biberger.
U.S. Appl. No. 12/962,533, filed Dec. 7, 2010, for Yin et al.
U.S. Appl. No. 12/962,523, filed Dec. 7, 2010, for Yin et al.
U.S. Appl. No. 12/001,643, filed Dec. 11, 2007, for Biberger et al.
U.S. Appl. No. 12/474,081, filed May 28, 2009, for Biberger et al.
U.S. Appl. No. 12/001,602, filed Dec. 11, 2007, for Biberger et al.
U.S. Appl. No. 12/001,644, filed Dec. 11, 2007, for Biberger et al.
U.S. Appl. No. 12/969,457, filed Nov. 15, 2010, for Leamon et al.
U.S. Appl. No. 12/969,503, filed Nov. 15, 2010, for Leamon et al.
U.S. Appl. No. 12/954,813, filed Nov. 26, 2010, for Biberger.
U.S. Appl. No. 12/954,822, filed Nov. 26, 2010, for Biberger.
U.S. Appl. No. 13/033,514, filed Feb. 23, 2011, for Biberger et al.
U.S. Appl. No. 13/589,024, filed Aug. 17, 2012, for Yin et al.
U.S. Appl. No. 13/801,726, filed Mar. 13, 2013, for Qi et al.

* cited by examiner

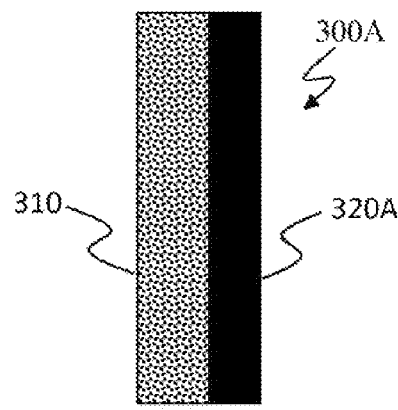
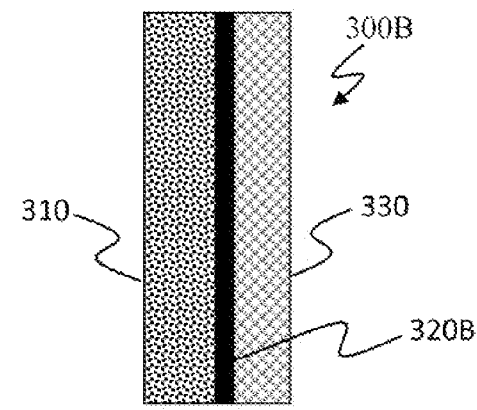
Fig. 3A   Fig. 3B
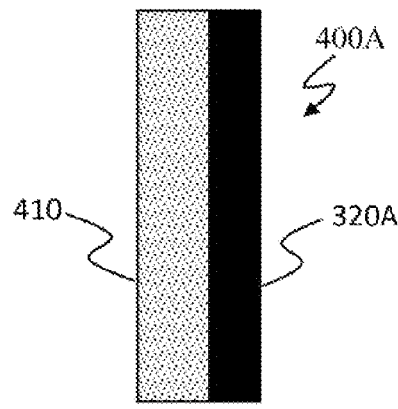
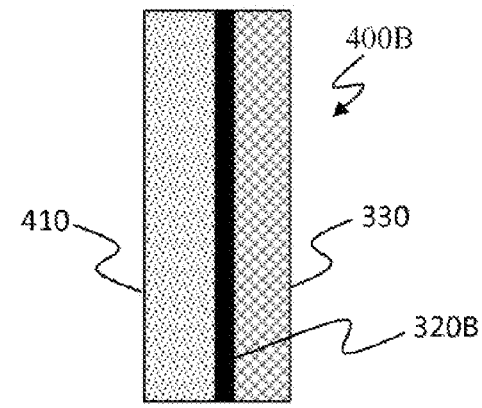
Fig. 4A   Fig. 4B
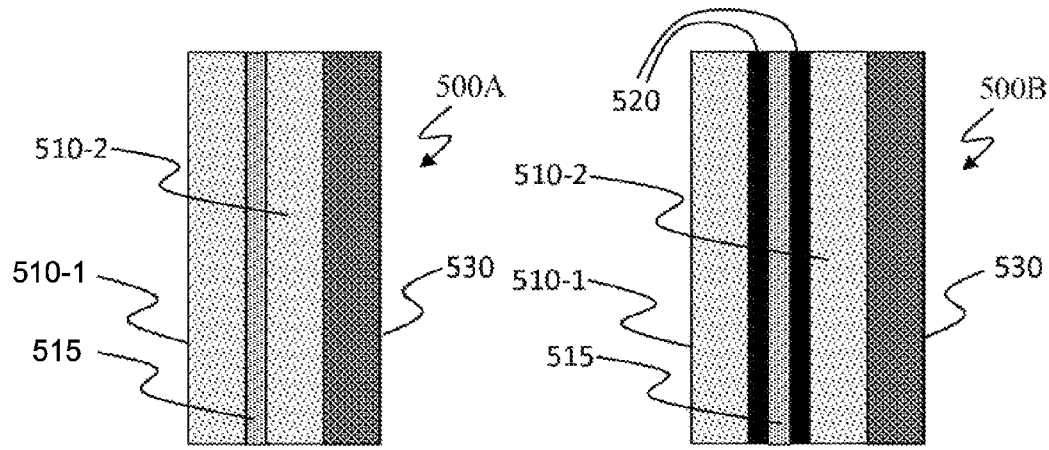
Fig. 5A   Fig. 5B

SANDWICH OF IMPACT RESISTANT MATERIAL

CROSS-REFERENCE TO RELATED APPLICATIONS

This application claims priority to U.S. Provisional Patent Application Ser. No. 61/284,329, filed Dec. 15, 2009 and entitled "MATERIALS PROCESSING," which is hereby incorporated herein by reference in its entirety as if set forth herein.

FIELD OF THE INVENTION

The present invention relates to the field of materials processing. More specifically, the present invention relates to the use of powders to form impact resistant materials.

BACKGROUND OF THE INVENTION

The purpose of body armor is to stop a high velocity projectile. Currently, the best known method of stopping a projectile is to have it fly against a plate that comprises a tile and a backing material.

One method that is typically used in the prior art to form the tile is reaction bonding. In one example, micron-sized silicon carbide or boron carbide powder is mixed with silicon powder and carbon black powder. The mixture is then put in a form, then placed in a high temperature oven, where the silicon is melted in order to have the silicon react at high temperature with the carbon to form silicon carbide and surround the silicon carbide or boron carbide particles with the silicon carbide particles. This concept is similar to the making of concrete.

Another method that is typically used in the prior art is the standard sintering of silicon carbide. Micron-sized silicon carbide particles are sintered together under high temperature to form a solid tile of about 99% density.

Silicon carbide and boron carbide are typically used because they have what is known in the industry as high hardness, meaning they are very good at stopping projectiles. However, they exhibit low fracture toughness, meaning that they are extremely brittle and are not good at resisting fracture when they have a crack. Therefore, although tiles made from these materials can slow down and stop a high velocity projectile, such as a bullet, they often shatter in the process and are only good for a single hit.

It is desirable to form a material that is harder, but that also is higher in fracture toughness. However, that concept is a contradiction is terms. Currently, the higher the fracture toughness of a material, the more that material becomes metal-like, which means less brittle and more ductile. The higher the hardness of the material, the lower the ductility and the higher the brittleness. FIG. 1 illustrates a graph that plots the fracture toughness versus the hardness (measured in hardness Vickers) of different materials. As can be seen, aluminum comprises a high fracture toughness of 10, but a low hardness value of 130. In comparison, a material that is formed from micron-sized silicon carbide or boron carbide powder that has been put through a conventional sintering process exhibits a high hardness value of 2000, but a low fracture toughness value of between 2 and 4. The problem of the prior art is evident by the trend line, which supports the concept that the harder a material becomes, the lower the fracture toughness it comprises, and the higher fracture toughness a material has, the softer that material becomes.

SUMMARY OF THE INVENTION

It is an object of the present invention to buck the prior art fracture toughness/hardness trend line and provide an impact resistant material that exhibits both a higher fracture toughness and a higher hardness.

While the present invention is particularly useful in forming body armor, it is contemplated that it may have a variety of other applications as well, all of which are within the scope of the present invention.

In one aspect of the present invention, a sandwich of impact resistant material is provided. The sandwich of impact resistant material comprises a first tile, a second tile, and a third tile coupled together. The first tile comprises a plurality of nano-particles bonded together, wherein the nano-structure of the nano-particles is present in the first tile. The first tile comprises a hardness value. The second tile comprises a plurality of nano-particles bonded together, wherein the nano-structure of the nano-particles is present in the second tile. The second tile comprises a hardness value. The third tile comprises a plurality of nano-particles bonded together, wherein the nano-structure of the nano-particles is present in the third tile. The third tile comprises a hardness value. The second tile is coupled in between the first tile and the third tile. The second tile comprises a hardness value greater than the first tile and the third tile.

In some embodiments, the hardness value of the first tile is between 1000 and 1500 HV. In some embodiments, the hardness value of the second tile is between 2500 and 3500 HV. In some embodiments, the hardness value of the third tile is between 1000 and 1500 HV.

In some embodiments, the nano-particles that form first tile and the third tile comprise silicon nitride nano-particles. In some embodiments, the nano-particles that form the second tile comprise tungsten carbide nano-particles, tantalum carbide nano-particles, or titanium carbide nano-particles.

In some embodiments, the nano-particles of the first tile, the second tile, and the third tile comprise an average grain size of 1 to 10 nanometers. In some embodiments, the nano-particles of the first tile, the second tile, and the third tile comprise an average grain size of 10 to 50 nanometers. In some embodiments, the nano-particles of the first tile, the second tile, and the third tile comprise an average grain size of 50 to 100 nanometers. In some embodiments, the nano-particles of the first tile, the second tile, and the third tile comprise an average grain size of 100 to 250 nanometers. In some embodiments, the nano-particles of the first tile, the second tile, and the third tile comprise an average grain size of 250 to 500 nanometers.

In some embodiments, the second tile is coupled between the first tile and the third tile via adhesive layers.

In some embodiments, the sandwich of impact resistant material further comprises a ductile backing layer coupled to the third tile on a side opposite the second tile. In some embodiments, the ductile backing layer comprises an adhesive layer. In some embodiments, the ductile backing layer comprises a layer of polyethylene fibers and an adhesive material.

In another aspect of the present invention, a method of making a sandwich of impact resistant material is provided. The method comprises: providing a first tile comprising a plurality of nano-particles bonded together, wherein the nano-structure of the nano-particles is present in the first tile and the first tile comprises a hardness value; providing a second tile comprising a plurality of nano-particles bonded together, wherein the nano-structure of the nano-particles is present in the second tile and the second tile comprises a hardness value; providing a third tile comprising a plurality of nano-particles bonded together, wherein the nano-structure of the nano-particles is present in the third tile and the third tile comprises a hardness value; and coupling the second tile in between the first tile and the third tile, wherein the second tile comprises a hardness value greater than the first tile and the third tile.

In some embodiments, the hardness value of the first tile is between 1000 and 1500 HV. In some embodiments, the hardness value of the second tile is between 2500 and 3500 HV. In some embodiments, the hardness value of the third tile is between 1000 and 1500 HV.

In some embodiments, the nano-particles that form first tile and the third tile comprise silicon nitride nano-particles. In some embodiments, the nano-particles that form the second tile comprise tungsten carbide nano-particles, tantalum carbide nano-particles, or titanium carbide nano-particles.

In some embodiments, the nano-particles of the first tile, the second tile, and the third tile comprise an average grain size of 1 to 10 nanometers. In some embodiments, the nano particles of the first tile, the second tile, and the third tile comprise an average grain size of 10 to 50 nanometers. In some embodiments, the nano-particles of the first tile, the second tile, and the third tile comprise an average grain size of 50 to 100 nanometers. In some embodiments, the nano-particles of the first tile, the second tile, and the third tile comprise an average grain size of 100 to 250 nanometers. In some embodiments, the nano-particles of the first tile, the second tile, and the third tile comprise an average grain size of 250 to 500 nanometers.

In some embodiments, the second tile is coupled between the first tile and the third tile via adhesive layers. In some embodiments, coupling the second tile in between the first tile and the third tile comprises performing a spark plasma sintering process on the nano-particles of the first tile, the second tile, and the third tile.

In some embodiments, a ductile backing layer is coupled to the third tile on a side opposite the second tile. In some embodiments, the ductile backing layer comprises an adhesive layer. In some embodiments, the ductile backing layer comprises a layer of polyethylene fibers and an adhesive material.

BRIEF DESCRIPTION OF THE DRAWINGS

FIG. 3A illustrates one embodiment of an impact resistant plate with an SPS-formed micron-structured tile in accordance with the principles of the present invention.

FIG. 3B illustrates another embodiment of an impact resistant plate with an SPS-formed micron-structured tile in accordance with the principles of the present invention.

FIG. 4A illustrates one embodiment of an impact resistant plate with an SPS-formed nano-structured tile in accordance with the principles of the present invention.

FIG. 4B illustrates another embodiment of an impact resistant plate with an SPS-formed nano-structured tile in accordance with the principles of the present invention.

FIG. 5A illustrates one embodiment of an impact resistant plate with three layers of SPS-formed nano-structured tiles in accordance with the principles of the present invention.

FIG. 5B illustrates another embodiment of an impact resistant plate with three layers of SPS-formed nano-structured tiles in accordance with the principles of the present invention.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

This disclosure refers to both particles and powders. These two terms are equivalent, except for the caveat that a singular "powder" refers to a collection of particles. The present invention may apply to a wide variety of powders and particles. Powders that fall within the scope of the present invention may include, but are not limited to, any of the following: (a) nano-structured powders (nano-powders), having an average grain size less than 250 nanometers and an aspect ratio between one and one million; (b) submicron powders, having an average grain size less than 1 micron and an aspect ratio between one and one million; (c) ultra-fine powders, having an average grain size less than 100 microns and an aspect ratio between one and one million; and (d) fine powders, having an average grain size less than 500 microns and an aspect ratio between one and one million.

Figure 2:
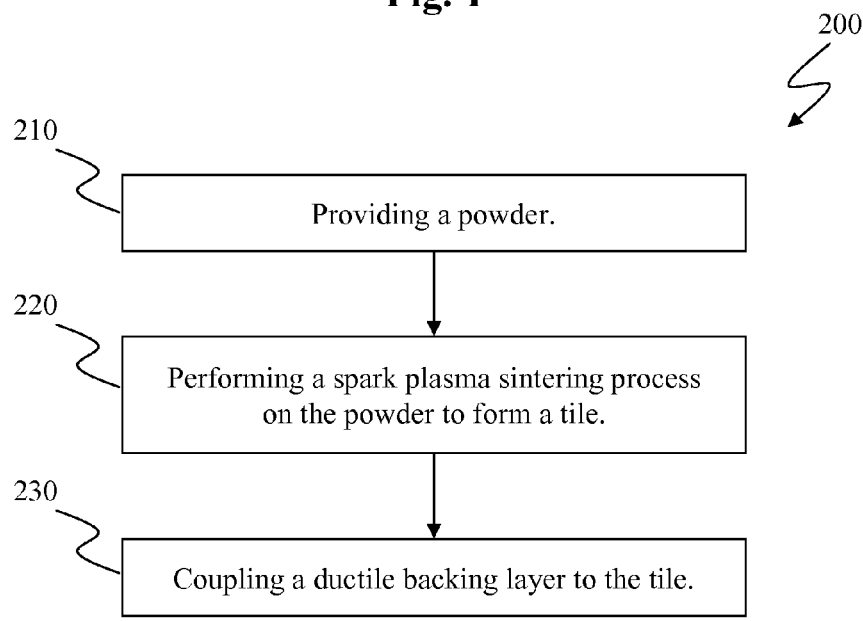
FIG. 2 illustrates one embodiment of a method of making an impact resistant material in accordance with the principles of the present invention.

FIG. 2 illustrates one embodiment of a method 200 of making an impact resistant material in accordance with the principles of the present invention.

At step 210, a powder is provided. In some embodiments, the powder comprises micron-sized particles. In some embodiments, the powder comprises an average grain size of 1 to 10 microns. In some embodiments, the powder comprises nano-particles. In some embodiments, the powder comprises an average grain size of 1 to 10 nanometers. In some embodiments, the powder comprises an average grain size of 10 to 50 nanometers. In some embodiments, the powder comprises an average grain size of 50 to 100 nanometers. In some embodiments, the powder comprises an average grain size of 100 to 250 nanometers. In some embodiments, the powder comprises an average grain size of 250 to 500 nanometers. In some embodiments, the powder comprises ceramic particles. In some embodiments, the powder comprises silicon carbide particles. In some embodiments, the powder comprises boron carbide particles. In some embodiments, the powder comprises cermet particles. For example, in some embodiments, the powder comprises particles having a silicon carbide core and a titanium outer layer inter-diffused with the silicon carbide core, thereby forming silicon carbide-titanium cermet particles.

At step 220, a spark plasma sintering process is performed on the powder to form a tile. Test results of the present invention have shown that by using spark plasma sintering instead of a conventional sintering process, an increase in both the hardness and the fracture toughness of a material can be achieved. In standard sintering, particles grow into larger particles during the process. Spark plasma sintering preserves the particle size throughout the sintering process all the way to the completed tile. In some embodiments, the tile is configured to cover the entire chest and a large portion of the abdomen of a human being. In some embodiments, the tile is approximately 0.4 inches thick and approximately 300 millimeters long.

At step 230, a backing layer is coupled to the tile. Preferably, the backing layer is ductile. In some embodiments, the backing layer comprises an adhesive layer. In some embodiments, the backing layer comprises a layer of polyethylene fibers and an adhesive layer coupling the layer of polyethylene fibers to the tile, wherein the adhesive layer comprises a thickness of 1 to 3 millimeters.

FIGS. 3A-5B illustrate different embodiments of the present invention, with like elements being numbered alike.

FIG. 3A illustrates one embodiment of an impact resistant plate 300A comprising a tile 310 and an adhesive backing layer 320A coupled to the tile 310. Tile 310 is formed by performing a spark plasma sintering process on micron sized powder. The micron structure of the powder is maintained by using a spark plasma sintering process instead of a conventional sintering process. In some embodiments, the powder comprises an average grain size of 1 to 10 microns. In some embodiments, the powder comprises ceramic particles. In some embodiments, the powder comprises silicon carbide particles. In some embodiments, the powder comprises boron carbide particles. In some embodiments, the tile is configured to cover the entire chest and a large portion of the abdomen of a human being. In some embodiments, the tile is approximately 0.4 inches thick and approximately 300 millimeters long. In some embodiments, the adhesive backing layer 320A comprises a glue manufactured by the chemical company BASF.

FIG. 3B illustrates another embodiment of an impact resistant plate 300B comprising tile 310, an adhesive layer 320B, and a ductile backing layer 330. In some embodiments, the adhesive layer 320B comprises a glue manufactured by the chemical company BASF. The adhesive layer 320B is preferably thinner than the adhesive layer 320A shown in FIG. 3A in order to accommodate the addition of the ductile backing layer 330. In some embodiments, the adhesive layer 320B comprises a thickness of 1 to 3 millimeters. In some embodiments, the ductile backing layer 330 comprises a layer of polyethylene fibers. In some embodiments, the ductile backing layer 330 comprises Dyneema® or Kevlar®.

Figure 1:
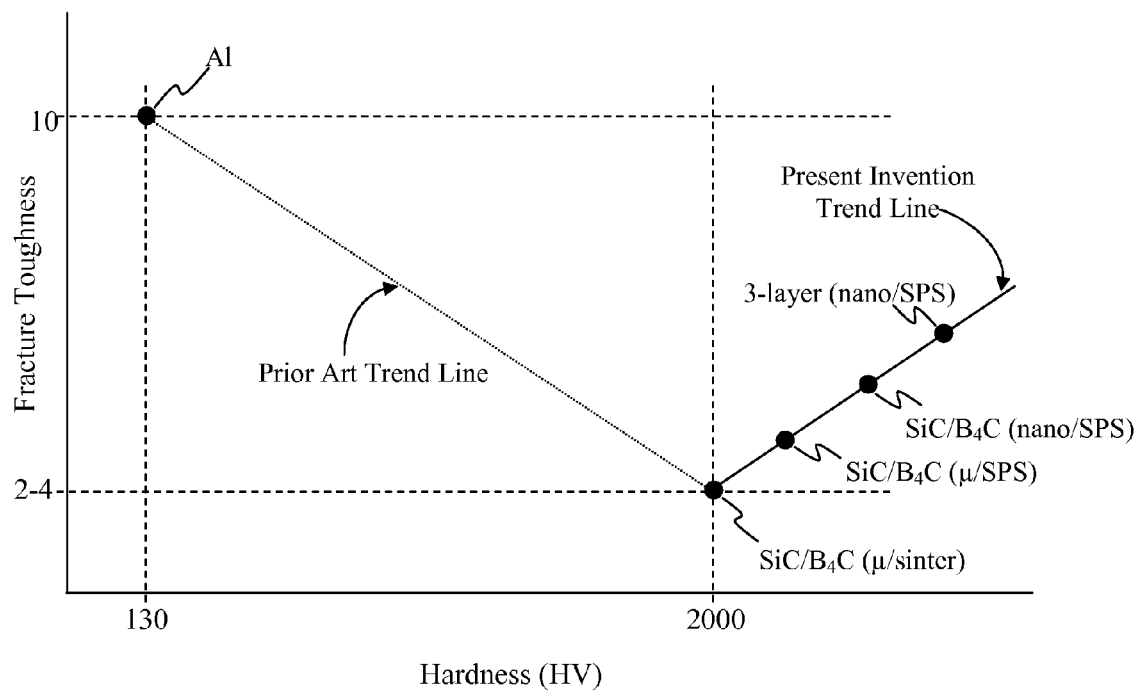
FIG. 1 illustrates a graph that plots the fracture toughness versus the hardness of different materials.

As seen in FIG. 1, using a spark plasma sintering process to form the tile as shown in FIGS. 3A-B instead of a conventional sintering process results in an impact resistant material with both an increased hardness value and an increased fracture toughness value over the prior art.

FIG. 4A illustrates one embodiment of an impact resistant plate 400A comprising a tile 410 and an adhesive backing layer 320A coupled to the tile 410. Tile 410 is formed by performing a spark plasma sintering process on nano-sized powder. The nano-structure of the powder is maintained by using a spark plasma sintering process instead of a conventional sintering process. In some embodiments, the powder comprises an average grain size of 1 to 10 nanometers. In some embodiments, the powder comprises an average grain size of 10 to 50 nanometers. In some embodiments, the powder comprises an average grain size of 50 to 100 nanometers. In some embodiments, the powder comprises an average grain size of 100 to 250 nanometers. In some embodiments, the powder comprises an average grain size of 250 to 500 nanometers. In some embodiments, the powder comprises ceramic particles. In some embodiments, the powder comprises silicon carbide particles. In some embodiments, the powder comprises boron carbide particles. In some embodiments, the tile is configured to cover the entire chest and a large portion of the abdomen of a human being. In some embodiments, the tile is approximately 0.4 inches thick and approximately 300 millimeters long. As mentioned above, in some embodiments, the adhesive backing layer 320A comprises a glue manufactured by the chemical company BASF.

FIG. 4B illustrates another embodiment of an impact resistant plate 400B comprising tile 410, adhesive layer 320B, and ductile backing layer 330. As mentioned above, in some embodiments, the adhesive layer 320B comprises a glue manufactured by the chemical company BASF. The adhesive layer 320B is preferably thinner than the adhesive layer 320A shown in FIG. 4A in order to accommodate the addition of the ductile backing layer 330. In some embodiments, the adhesive layer 320B comprises a thickness of 1 to 3 millimeters. In some embodiments, the ductile backing layer 330 comprises a layer of polyethylene fibers. In some embodiments, the ductile backing layer 330 comprises Dyneema® or Kevlar®.

As seen in FIG. 1, using a nano-structured tile as shown in FIGS. 4A-B instead of a micron-structured tile, in addition to using a spark plasma sintering process to form the tile instead of a conventional sintering process, results in an impact resistant material with both an increased hardness value and an increased fracture toughness value over the prior art and the embodiments of FIGS. 3A-B.

FIG. 5A illustrates one embodiment of an impact resistant plate 500A comprising hard tiles 510-1 and 510-2 and an ultra-hard tile 515 sandwiched between the hard tiles 510-1 and 510-2. Hard tiles 510-1 and 510-2 are nano-structured tiles formed by performing a spark plasma sintering process on nano-powder. In some embodiments, the nano-powder comprises an average grain size of 1 to 10 nanometers. In some embodiments, the nanao-powder comprises an average grain size of 10 to 50 nanometers. In some embodiments, the nano-powder comprises an average grain size of 50 to 100 nanometers. In some embodiments, the nano-powder comprises an average grain size of 100 to 250 nanometers. In some embodiments, the nano-powder comprises an average grain size of 250 to 500 nanometers. In a preferred embodiment, the tiles 510-1 and 510-2 have a high hardness value and a high fracture toughness value. In some embodiments, the tiles 510-1 and 510-2 have a hardness value of approximately 1000-1500 HV. One example of a good candidate for the powder to be used to form the tiles 510-1 and 510-2 is silicon nitride. Of course, it is contemplated that other materials can be used as well.

Ultra-hard tile 515 is also a nano-structured tile formed by performing a spark plasma sintering process on nano-powder. In some embodiments, the nano-powder comprises an average grain size of 1 to 10 nanometers. In some embodiments, the nanao-powder comprises an average grain size of 10 to 50 nanometers. In some embodiments, the nano-powder comprises an average grain size of 50 to 100 nanometers. In some embodiments, the nano-powder comprises an average grain size of 100 to 250 nanometers. In some embodiments, the nano-powder comprises an average grain size of 250 to 500 nanometers. In a preferred embodiment, the ultra-hard tile 515 has an extremely high hardness value that is higher than the hardness values for tiles 510-1 and 510-2. In some embodiments, the ultra-hard tile has a hardness value of approximately 2500-3500 HV. In contrast to the tiles 510-1 and 510-2, the fracture toughness for ultra-hard tile 515 is allowed to be somewhat low. Examples of good candidates for the powder to be used to form the ultra-hard tile 515 include tungsten carbide, tantalum carbide, and titanium carbide. Of course, it is contemplated that other materials can be used as well.

A backing layer 530 is coupled to tile 510-2. In some embodiments, the backing layer 530 is ductile. In some embodiments, the backing layer 530 comprises an adhesive layer and ductile backing material. In some embodiments, the adhesive layer comprises a glue manufactured by the chemical company BASF. In some embodiments, the ductile backing material comprises a layer of polyethylene fibers. In some embodiments, the ductile backing material comprises Dyneema® or Kevlar®. In some embodiments, the backing layer 530 is formed using soaked fibers, a resin, and a hardener, such as disclosed in SDC-2800, filed herewith, entitled "WORKFLOW FOR NOVEL COMPOSITE MATERIALS," which is hereby incorporated by reference in its entirety as if set forth herein.

It is important for there to be a good bond between tiles 510-1, 510-2, and 515. In some embodiments, the three layers are sintered together using a spark plasma sintering process. In one example of such an embodiment, the powder for tile 510-1 is poured into a form. A die is lowered to press the powder. The die is ramped back up. A layer of the powder for tile 515 is then poured into the form on top of the pressed powder. The die is again lowered to press the powder. The die is ramped back up. A layer of the powder for tile 510-2 is then poured into the form on top of the pressed powder. The die is once again lowered to press the powder. Heat, such as through spark plasma sintering, is then applied to the pressed powder in order to bond the three tile layers together.

In an alternative embodiment, an adhesive, such as a glue manufactured by the chemical company BASF, is placed between the three tile layers in order to bond them together. FIG. 5B illustrates one embodiment of an impact resistant plate 500B where tiles 510-1, 510-2, and 515 are bonded together using an adhesive layer 520 between tiles 510-1 and 515 and between tiles 515 and 510-2.

As seen in FIG. 1, using three layers of SPS-formed nanostructured tiles as shown in FIGS. 5A-B results in an impact resistant material with both an increased hardness value and an increased fracture toughness value over the prior art and the embodiments of FIGS. 3A-4B.

Figure 6:
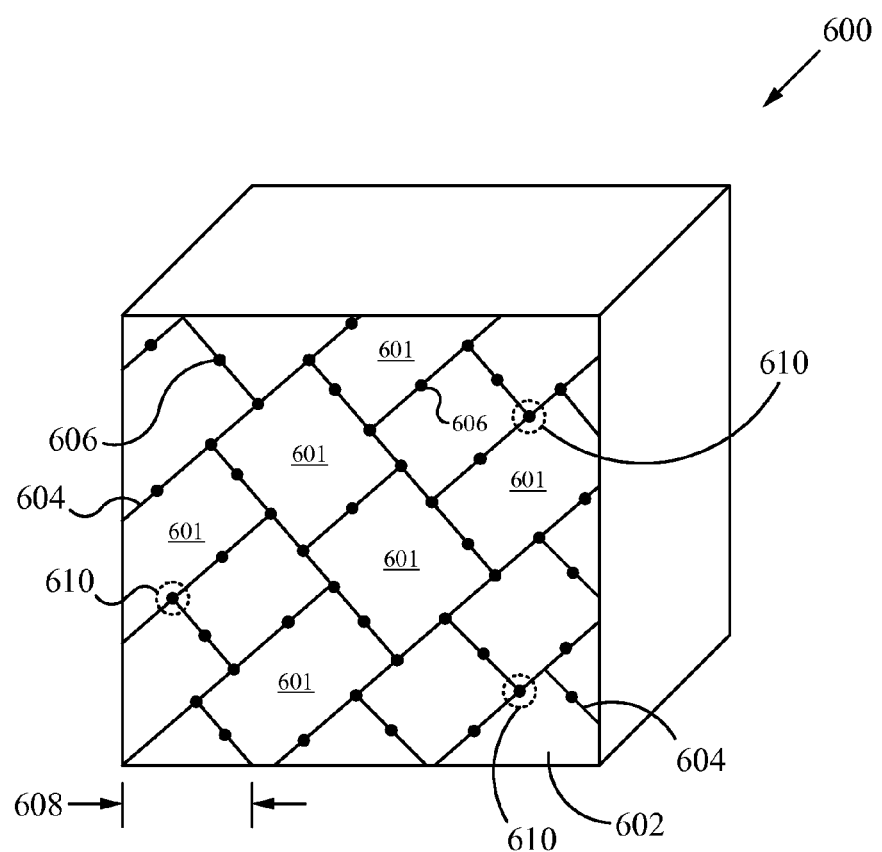
FIG. 6 illustrates one embodiment of a ceramic manufacture with improved fracture toughness in accordance with the principles of the present invention.

In some embodiments, the present invention employs a novel process for making the tiles, such as tiles 310, 410, 510-1, 510-2, and 515. Turning to FIG. 6, a ceramic tile 600 with improved fracture toughness is shown in accordance with an embodiment of the present invention. The tile 600 comprises a composite of ceramic material 601 and nano-particles 606.

The ceramic material 601 can comprise any number of suitable ceramic materials depending on a particular application. In an exemplary embodiment, the ceramic material 601 comprises a material from a group of non-oxide ceramics. These non-oxide ceramics can include, but are not limited to, any of the carbides, borides, nitrides, and silicides. Examples of a suitable non-oxide ceramic include, but are not limited to, silicon carbide and boron carbide. In an alternative embodiment, the ceramic material 601 can comprise an oxide ceramic material. Examples of suitable oxide ceramic include, but are not limited to, alumina and zirconia. In yet another embodiment, the ceramic material 601 can comprise a combination of oxide and non-oxide ceramic materials.

The method as described in detail below produces the tile 600 in a final form that includes grains 604 having a crystalline or granular structure propagated throughout the tile 600. In some embodiments, the granular structure of the tile 600 comprises grains 604 having an average grain boundary distance or diameter 608 of one to several micrometers. In some embodiments, the average grain diameter 608 equals approximately one micrometer. In some embodiments, the ceramic particles 601 have an average grain size greater than or equal to 1 micron. In some embodiments, the ceramic particles 601 have an average grain size of approximately 40 microns.

The nano-particles 606 comprise any number of suitable materials that can be utilized depending on a particular application. In some embodiments, the nano-particles 606 comprise a material from a group of non-oxide ceramics. Examples of suitable non-oxide ceramics include, but are not limited to, titanium carbide and titanium diboride. In some embodiments, the nano-particles 606 can comprise an oxide ceramic material. Examples of suitable oxide ceramic materials include, but are not limited to, alumina and zirconia. In some embodiments, the nano-particles 606 comprise a metallic material.

The novel method of the present invention produces the tile 600 having nano-particles 606 bonded within the grains 604. In a preferred embodiment, the nano-particles 606 are bonded within the grains 604 of the ceramic material 601 such that a bonding force between the nano-particles 606 and the ceramic material 601 are believed to be present in addition to an inherent ionic or covalent bond of the ceramic material 601. A surface 602 of the tile 600 reveals that the nano-particles 606 are substantially uniformly distributed throughout the granular structure. Additionally, the tile 600 includes the nano-particles 606 substantially uniformly distributed throughout the three dimensional volume of the tile 600. A novel result of the method of the present invention includes the nano-particles 606 being substantially uniformly distributed at triple points 610 of the ceramic material 601. The nano-particles 606 comprise an average diameter suitable for bonding within the grains 604 of the ceramic material. In some embodiments, the nano-particles 606 have an average grain size less than or equal to 10 nanometers. In some embodiments, the nano-particles 606 have an average diameter of approximately 10 to 40 nanometers. In some embodiments, the average diameter of the nano-particles 606 is 20 nanometers +/−10 nanometers. In some embodiments, the nano-particles 606 have an average grain size of approximately 5 to 15 nanometers.

Figure 7:
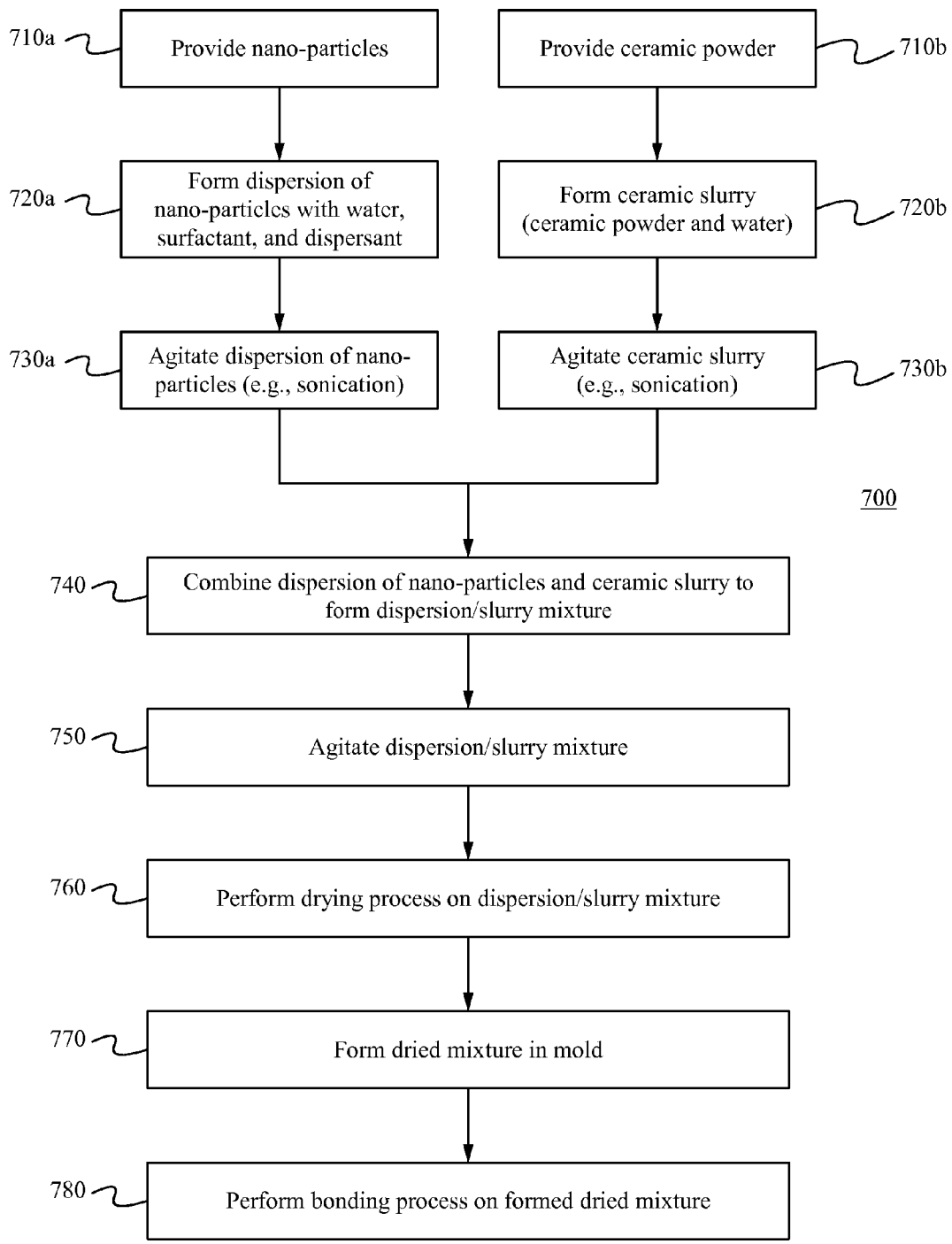
FIG. 7 illustrates one embodiment of a method of making an enhanced ceramic material in accordance with the principles of the present invention.
Figure 9:
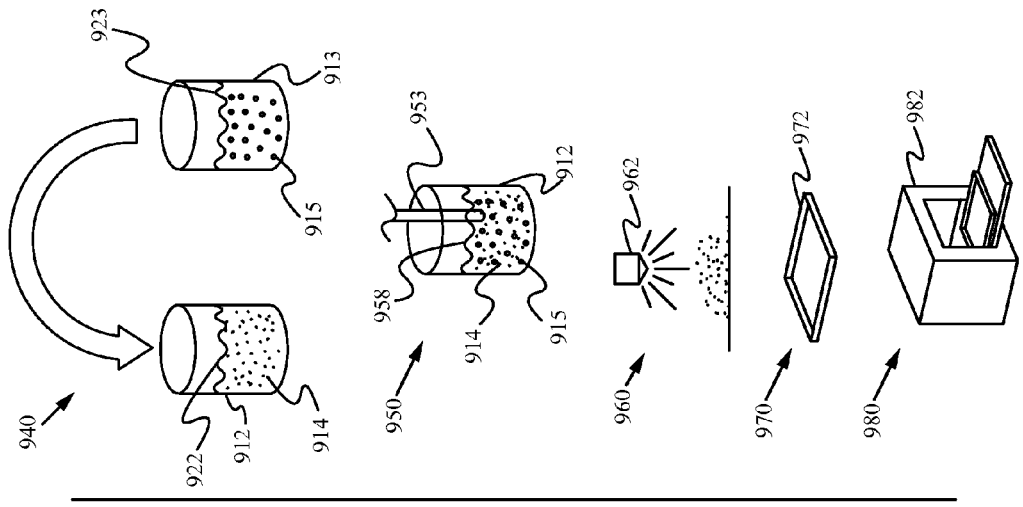
FIG. 9 is an illustration of one embodiment of making an enhanced ceramic material in accordance with the principles of the present invention.
Figure 9:
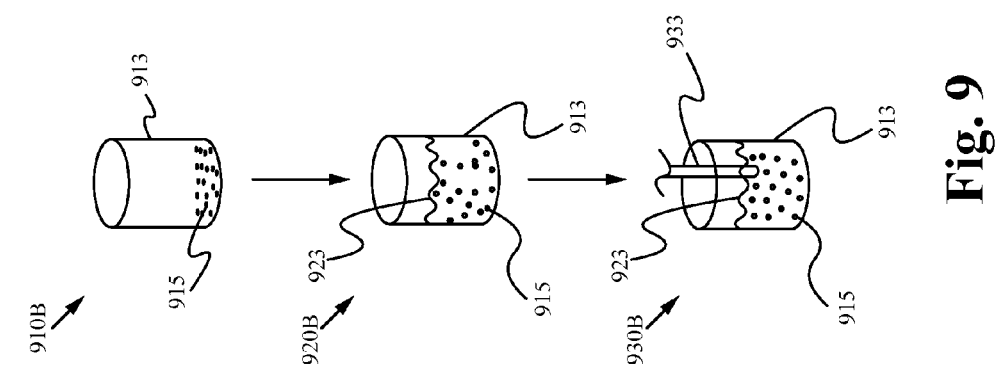
Figure 9:
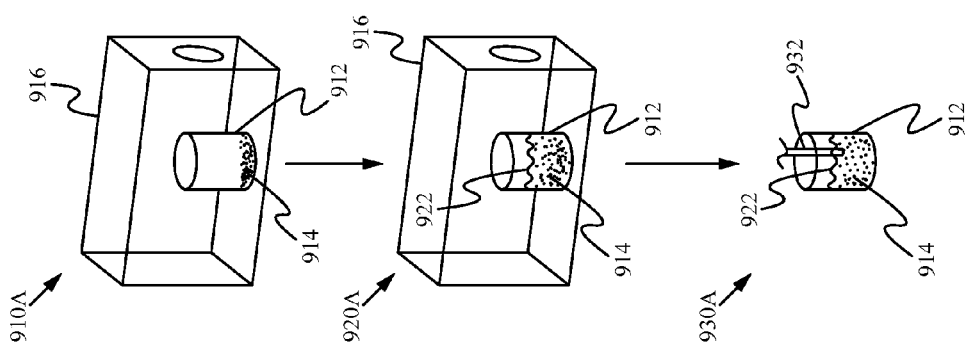

FIG. 7 illustrates one embodiment of a method 700 of making a ceramic with improved fracture toughness in accordance with the principles of the present invention. FIG. 9 provides an illustration of one embodiment of making an enhanced ceramic material in order to aid in the visualization of the method, with certain steps in FIG. 9 corresponding to certain steps in FIG. 9. It is noted that the present invention is not merely limited to the shapes, sizes and configurations shown in FIG. 9.

At step 710a, a plurality of nano-particles is provided. The nano-particles can be in the form of a powder. As discussed above, the nano-particles comprise an average diameter suitable for bonding within the grains of the ceramic material. Depending on the application, the size of the nano-particles can vary. The size of the nano-particles includes, but is not limited to, the size ranges discussed above. In a preferred embodiment, the nano-particles are substantially uniform in size.

The nano-particles can be formed by introducing micron sized material into a plasma process, such as described and claimed in the co-owned and co-pending application Ser. No. 11/110,341, filed Apr. 19, 2005, and titled "High Throughput Discovery of Materials Through Vapor Phase Synthesis," and the co-owned and co-pending application Ser. No. 12/151, 935, filed May 8, 2008, and titled "Highly Turbulent Quench Chamber," both of which are hereby incorporated by reference as if set forth herein.

Figure 8:
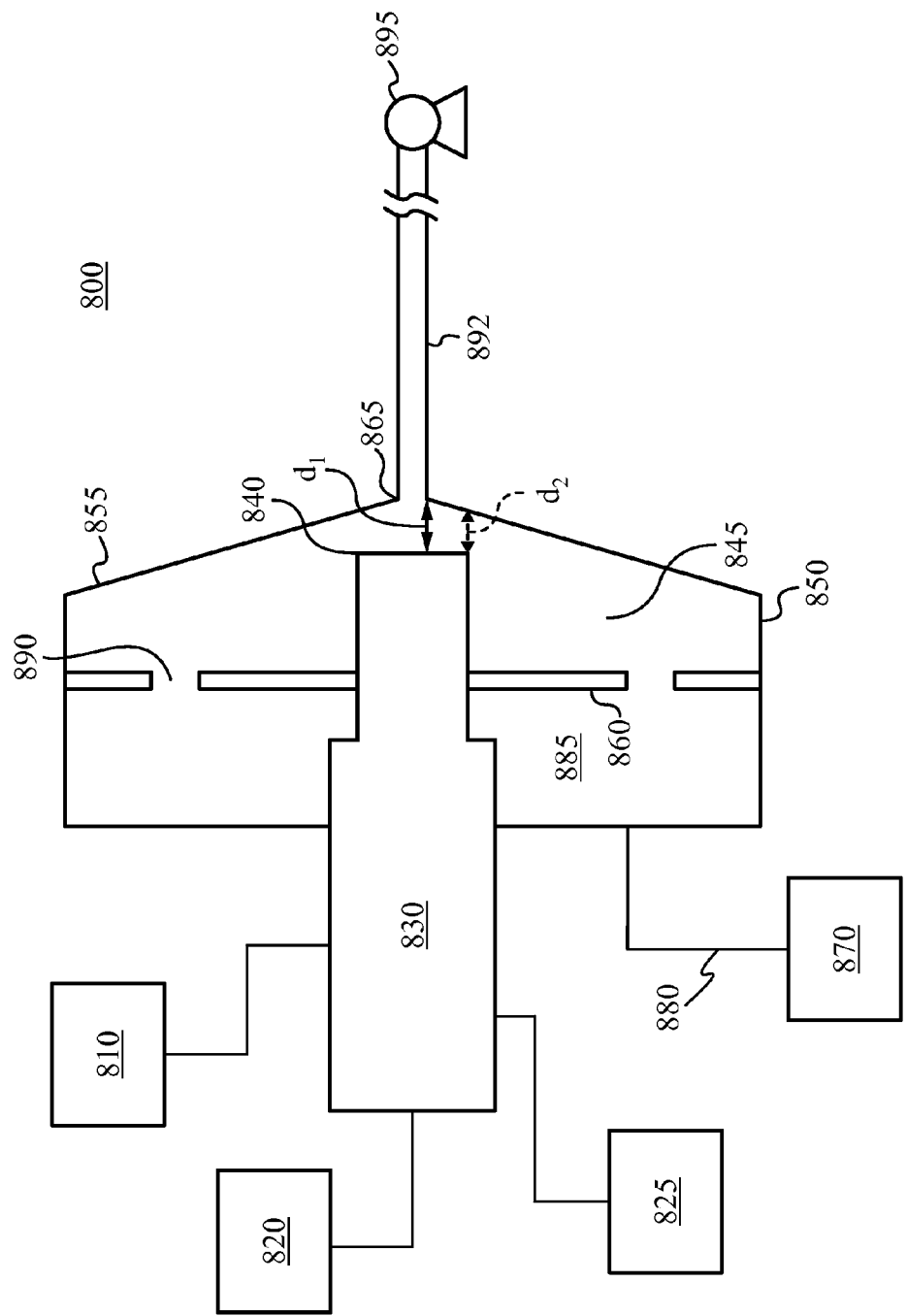
FIG. 8 illustrates one embodiment of a particle production system in accordance with the principles of the present invention.

FIG. 8 illustrates a particle production system 800 that uses a plasma process and a highly turbulent quench chamber 845 to produce nano-particles. The system 800 comprises a precursor supply device 810 a working gas supply device 820 fluidly coupled to a plasma production and reaction chamber 830. An energy delivery system 825 is also coupled with the plasma production and reactor chamber 830. The plasma production and reactor chamber 830 includes an injection port 840 that communicates fluidly with the constricting quench chamber 845. One or more ports 890 can also allow fluid communication between the quench chamber 845 and a controlled atmosphere system 870. The quench chamber 845 is also fluidly coupled to an outlet 865.

Generally, the chamber 830 operates as a reactor, producing an output comprising particles within a gas stream. Production includes the basic steps of combination, reaction, and conditioning as described later herein. The system combines precursor material supplied from the precursor supply device 810 and working gas supplied from the working gas supply device 820 within the energy delivery zone of the chamber 830.

In some embodiments, the precursor material comprises a powdered substance. In some embodiments, the precursor material is micron-sized. In some embodiments, the precursor material comprises an average grain diameter of 500-600 nanometers. In some embodiments, the precursor material comprises an average grain diameter of one micrometer. In some embodiments, the precursor material comprises an average grain diameter greater than or equal to 5 microns.

The system energizes the working gas in the chamber 830 using energy from the energy supply system 825, thereby forming a plasma. The plasma is applied to the precursor material within the chamber 830 to form an energized, reactive mixture. This mixture comprises one or more materials in at least one of a plurality of phases, which may include vapor, gas, and plasma. The reactive mixture flows from the plasma production and reactor chamber 830 into the quench chamber 845 through an injection port 840.

The quench chamber 845 preferably comprises a substantially cylindrical surface 850, a frusto-conical surface 855, and an annular surface 860 connecting the injection port 440 with the cylindrical surface 850. The frusto-conical surface 860 narrows to meet the outlet 865. The plasma production and reactor chamber 830 includes an extended portion at the end of which the injection port 840 is disposed. This extended portion shortens the distance between the injection port 840 and the outlet 865, reducing the volume of region in which the reactive mixture and the conditioning fluid will mix, referred to as the quench region. In a preferred embodiment, the injection port 840 is arranged coaxially with the outlet 865. The center of the injection port is positioned a first distance $d_1$ from the outlet 865. The perimeter of the injection port is positioned a second distance $d_2$ from a portion of the frusto-conical surface 855. The injection port 840 and the frusto-conical surface 855 form the aforementioned quench region therebetween. The space between the perimeter of the injection port 840 and the frusto-conical surface 855 forms a gap therebetween that acts as a channel for supplying conditioning fluid into the quench region. The frusto-conical surface 855 acts as a funneling surface, channeling fluid through the gap and into the quench region.

While the reactive mixture flows into the quench chamber 845, the ports 890 supply conditioning fluid into the quench chamber 845. The conditioning fluid then moves along the frusto-conical surface 855, through the gap between the injection port 840 and the frusto-conical surface 855, and into the quench region. In some embodiments, the controlled atmosphere system 870 is configured to control the volume flow rate or mass flow rate of the conditioning fluid supplied to the quench region.

As the reactive mixture moves out of the injection port 840, it expands and mixes with the conditioning fluid. Preferably, the angle at which the conditioning fluid is supplied produces a high degree of turbulence and promotes mixing with the reactive mixture. This turbulence can depend on many parameters. In a preferred embodiment, one or more of these parameters is adjustable to control the level of turbulence. These factors include the flow rates of the conditioning fluid, the temperature of the frusto-conical surface 855, the angle of the frusto-conical surface 855 (which affects the angle at which the conditioning fluid is supplied into the quench region), and the size of the quench region. For example, the relative positioning of the frusto-conical surface 855 and the injection port 840 is adjustable, which can be used to adjust the volume of quench region. These adjustments can be made in a variety of different ways, using a variety of different mechanisms, including, but not limited to, automated means and manual means.

During a brief period immediately after entering the quench chamber 845, particle formation occurs. The degree to which the particles agglomerate depends on the rate of cooling. The cooling rate depends on the turbulence of the flow within the quench region. Preferably, the system is adjusted to form a highly turbulent flow, and to form very dispersed particles. For example, in preferred embodiments, the turbidity of the flow within the quench region is such that the flow has a Reynolds Number of at least 1000.

Still referring to FIG. 8, the structure of the quench chamber 845 is preferably formed of relatively thin walled components capable of dissipating substantial quantities of heat. For example, the thin-walled components can conduct heat from inside the chamber and radiate the heat to the ambient.

Substantial heat is emitted, mostly in the form of radiation, from the reactive mixture following its entry into the quench chamber 845. The quench chamber 845 is designed to dissipate this heat efficiently. The surfaces of the quench chamber 845 are preferably exposed to a cooling system (not shown). In a preferred embodiment, the cooling system is configured to control a temperature of the frusto-conical surface 855.

Following injection into the quench region, cooling, and particle formation, the mixture flows from the quench chamber 845 through the outlet port 865. Suction generated by a generator 895 moves the mixture and conditioning fluid from the quench region into the conduit 892. From the outlet port 865, the mixture flows along the conduit 892, toward the suction generator 895. Preferably, the particles are removed from the mixture by a collection or sampling system (not shown) prior to encountering the suction generator 895.

Still referring to FIG. 8, the controlled atmosphere system 870 comprises a chamber 885, fluidly coupled to the quench region through port(s) 890, into which conditioning fluid is introduced from a reservoir through a conduit 880. As described above, the conditioning fluid preferably comprises argon. However, other inert, relatively heavy gases are equally preferred. Also, as discussed above, the preferable mechanism of providing the conditioning fluid into the quench chamber 845 is the formation of a pressure differential between the quench chamber 845 and the outlet 865. Such pressure differential will draw the conditioning fluid into the quench chamber 845 through the ports 890. Other methods of providing the conditioning fluid include, but are not limited to, forming positive pressure within the chamber 885.

The angle of the frusto-conical surface affects the angle at which the conditioning fluid is supplied into the quench region, which can affect the level of turbulence in the quench region. The conditioning fluid preferably flows into the quench region along a plurality of momentum vectors. The greater the degree of the angle between the momentum vectors, the higher the level of turbulence that will be produced. In a preferred embodiment, the high turbulent quench chamber comprises a frusto-conical surface that is configured to funnel at least two conditioning fluid momentum vectors into the quench region such that there is at least a 90 degree angle between the two momentum vectors. It is contemplated that other angle degree thresholds may be applied as well. For example, attention may also be paid to the angle formed between at least one of the conditioning fluid momentum vectors and the momentum vector of the reactive mixture. In one embodiment of a highly turbulent quench chamber, a reactive mixture inlet is configured to supply the reactive mixture into the quench region along a first momentum vector, the frusto-conical surface is configured to supply the conditioning fluid to the quench region along a second momentum vector, and the second momentum vector has an oblique angle greater than 20 degrees relative to the first momentum vector.

The size of the quench region also affects the level of turbulence in the quench region. The smaller the quench region, the higher the level of turbulence that will be produced. The size of the quench region can be reduced by reducing the distance between the center of the injection port 840 and the outlet 865.

The high turbulence produced by the embodiments of the present invention decreases the period during which particles formed can agglomerate with one another, thereby producing particles of more uniform size, and in some instances, producing smaller-sized particles. Both of these features lead to particles with increased dispersibility and increased ratio of surface area to volume. While the plasma process described above is extremely advantageous in producing the nano-particles, it is contemplated that the nano-particles can be produced in other ways as well.

Referring to the embodiment illustrated in FIG. 9, at step 910A, the nano-particles 914 are provided in a container 912. In a preferred embodiment, the nano-particles 914 are produced and provided under completely inert conditions, which can be achieved in a variety of ways. In some embodiments, the plasma process described above is performed in an oxygen free environment, with the plasma gun being run with an inert gas, such as argon or nitrogen, and a reducing gas, such as hydrogen. In some embodiments, the produced nano-particles 914 are then collected under inert conditions in a glove box 916. In some embodiments, an inert gas, such as argon, is present in the glove box 916 prior to the nano-particles 914 being placed in it. Since the residual amount of oxygen in the nano-particles is key for the success of the subsequent sintering process, which will be discussed below, it is preferable to minimize, if not completely eliminate, the amount of oxygen present in the nano-particle environment.

At step 720a, a dispersion 922 of the nano-particles 914 is prepared, preferably within the glove box 916, as shown at step 920A, or using some other means of providing inert conditions. The dispersion 922 comprises a suspension of the nano-particles 914 in a suitable liquid or suspension liquid. In some embodiments, the liquid comprises water and a surfactant. In a preferred embodiment, the liquid comprises water, a surfactant, and a dispersant.

In some embodiments, the surfactant is a non-ionic surfactant. In some embodiments, the surfactant is some type of polyethylene oxide material. In some embodiments, the surfactant is a non-volatile oxazoline-type compound. One suitable example of a surfactant that is a non-volatile-type compound is sold under the name Alkaterge™. It is contemplated that other surfactants can be used for the dispersion. In some embodiments, the dispersant is SOLSPERSE® 46000, manufactured by Lubrizol Corporation. However, it is contemplated that other dispersants can be used for the dispersion.

The concentrations by weight of the nano-particles, water, surfactant, and dispersant in the dispersion can be varied depending on the application and all ranges are within the scope of the present invention. However, testing has shown that certain concentrations provide better results than others. For example, a low weight percentage for the nano-particles results in better mixing with the ceramic slurry, which will be discussed in further detail below. In some embodiments, the nano-particles comprise 0.5-20% of the dispersion. However, testing has shown that a nano-particle concentration of 10% or greater does not result in good mixing with the ceramic slurry. In some embodiments, the nano-particles comprise 0.5-10% of the dispersion. In some embodiments, the nano-particles comprise approximately 10% of the dispersion. In some embodiments, the nano-particles comprise approximately 1.0% of the dispersion. In some embodiments, the surfactant comprises approximately 10% of the dispersion. In some embodiments, the surfactant comprises approximately 3% of the dispersion. In some embodiments, the dispersant comprises approximately 5% of the dispersion. In some embodiments, the dispersant comprises approximately 2% of the dispersion. In some embodiments, water comprises approximately 85% of the dispersion. Depending on the desired ratio and the process to be performed, the dispersion can be further diluted by simply adding more water to the already formed dispersion.

One feature of the present invention is that the dispersion comprises a substantially uniform distribution of the nano-particles within the dispersion liquid. The uniform dispersion prevents forming large aggregations of the nano-particles, which facilitates a uniform diameter of the nano-particles in the liquid. A high concentration of large aggregations of nano-particles can inhibit the desired uniform distribution of the nano-particles within the grains 604 of the tile 600.

Once the nano-particles are in the dispersion liquid, it is no longer required to provide an inert environment through the use of the glove box or similar means. The dispersion liquid provides a stable environment for the nano-particles 914. The container 912 holding the dispersion 922 can be removed from the glove box 916 and operated on further.

At step 730a, some embodiments include agitating the dispersion of nano-particles in order to help completely and uniformly disperse the nano-particles in the dispersion liquid. In a preferred embodiment, sonication is used to agitate the dispersion and disperse the nano-particles within the liquid. As shown at step 930A in FIG. 9, a sonicator 932 can be placed in and provide sonic energy to the dispersion 922. Dry nano-particles have a tendency to stick together due to Van der Waals forces. As a result, the nano-particles can form loose agglomerates in the dispersion liquid, with surfactant polymer chains floating around in the liquid. The sonic energy from the sonicator causes the agglomerates to break up. The dispersant absorbs onto the surface of the nano-particles and coats them. In a preferred embodiment, the dispersant is chosen so that one portion of the dispersant couples onto the surface of the nano-particle and the other portion couples into the water, thereby helping the nano-particles stay afloat and dispersed. The surfactant remains in the solution, while some of it is absorbed onto the edge of the nano-particles. The surfactant chains repel each other, thereby preventing the particles from agglomerating again. The length of the sonication depends on the volume of the dispersion liquid. In some embodiments with a small dispersion volume, the sonication is performed for between 30 minutes and 1 hour. In some embodiments with a large volume, the sonication is performed for half a day.

In some embodiments, the solution is taken the way it is and analyzed. This analysis can include, but is not limited to, checking the viscosity; performing a Dynamic Light Scattering process and getting a Z-average to determine the particle size that is left in dispersion, and performing a dry down and determining the weight percentage of solid material in the dispersion. Modifications can be made if any of the measurements reveal insufficient characteristics of the dispersion. In some embodiments, it is preferable to have the nano-particles account for approximately 1-7% by weight of the dispersion.

At step 710b, a ceramic powder is provided. At step 910B in FIG. 9, the ceramic powder 915 is shown being held in a container 913. The ceramic powder is what makes up the ceramic material 601 discussed above. As previously mentioned, the ceramic powder can comprise any number of suitable ceramic materials depending on a particular application. In an exemplary embodiment, the ceramic powder comprises a material from a group of non-oxide ceramics. These non-oxide ceramics can include, but are not limited to, any of the carbides, borides, nitrides, and silicides. Examples of a suitable non-oxide ceramic include, but are not limited to, silicon carbide and boron carbide. In an alternative embodiment, the ceramic powder can comprise an oxide ceramic material. Examples of suitable oxide ceramic include, but are not limited to, alumina and zirconia. In yet another embodiment, the ceramic powder can comprise a combination of oxide and non-oxide ceramic materials. While the size of the ceramic powder can vary from embodiment to embodiment, it is important that it not be too small. If the ceramic powder is too small, it leads to runaway grain growth during the sintering process. This runaway growth produces big clumps of ceramic material with large grains. The presence of large grains decreases the fracture toughness of the manufacture. In some embodiments, the ceramic particles have an average grain size greater than or equal to 1 micron. In some embodiments, the ceramic particles have an average grain size of approximately 40 microns. In some embodiments, the ceramic particles have an average diameter of 500-600 nm.

At step 720b, a ceramic slurry is formed from the ceramic powder. Step 920B of FIG. 9 shows this slurry 923 of ceramic particles 915 in the container 913. The ceramic slurry preferably comprises a viscous suspension of the ceramic powder in a suitable liquid. In some embodiments, forming the ceramic slurry comprises adding the liquid to the container holding the ceramic powder. In some embodiments, the ceramic powder comprises 50% by weight of the slurry. However, it is contemplated that other concentrations are within the scope of the present invention. In an exemplary embodiment, the suspension liquid comprises water. Other liquids known to a person of skill can also be utilized. In some embodiments, the slurry includes various additives or binders that facilitate a mixing, a drying, and a sintering step described later below.

In some embodiments, it is advantageous to mix up the ceramic slurry, since the ceramic particles may have begun to settle and agglomerate. Accordingly, at step 730b, the ceramic slurry is agitated. In some embodiments, such as shown in step 930B of FIG. 9, a sonicator 933 is placed in the ceramic slurry 923 in order to provide sonic energy to the slurry and mix it up, thereby dispersing the ceramic particles in the slurry. In some embodiments (not shown), the slurry 923 is pumped out of the container 913 and through a sonicator, where it is sonicated, and then sent back into the container 913.

At step 740, the dispersion of nano-particles and the ceramic slurry are combined to form a dispersion/slurry mixture. In some embodiments, such as seen in step 940 of FIG. 9, the ceramic slurry 923 is poured, pumped, or otherwise moved into a container already holding the nano-particle dispersion 922, not the other way around. Although it is counterintuitive, test results have shown that movement of the ceramic slurry into the nano-particle dispersion provides a much better dispersion of nano-particles in the resulting mixture than if the nano-particle dispersion were moved into the ceramic slurry. It is believed that the relatively large size of the ceramic particles in the ceramic slurry and the accompanying velocity help break through and break up the nano-particles in the dispersion. When the nano-particles are poured into the ceramic slurry, they have a tendency to clump together rather than disperse.

In some embodiments, it is beneficial to further mix the dispersion/slurry mixture, such as shown at step 750. The mixing of the nano-dispersion/slurry mixture produces a dispersion of the nano-particles within the slurry such that the nano-particles are uniformly distributed throughout the nano-dispersion/slurry mixture. The mixing of the nano-dispersion/slurry mixture can comprise suitable agitation methods known to a person of skill. These agitation methods can be performed during or after the ceramic slurry is moved into the nano-dispersion. In some embodiments, the mixing can be accomplished by simply pouring the slurry slowly into the dispersion. In some embodiments, a stir bar is used to agitate the nano-dispersion/slurry mixture. In some embodiment, such as shown in step 950 of FIG. 9, a sonicator 953 is placed in the dispersion/slurry mixture 958 and provides sonic energy, thereby completely and uniformly dispersing the nano-particles 914 within the mixture 958, as well as helping to coat the nano-particles 914 with any additives that have been used. It is contemplated that other mixing techniques known to a person of skill in the art can be substituted for the mixing and agitation described above. Furthermore, any number or combination of agitation methods can be used.

In some embodiments, the nano-particles account for 0.5% to 20% by weight of the nano-dispersion/slurry mixture. In some embodiments, the nano-particles account for 0.5% to 10% by weight of the nano-dispersion/slurry mixture. In some embodiments, the nano-particles account for 0.5% to 3.0% by weight of the nano-dispersion/slurry mixture. In some embodiments, the nano-particle dispersion and the ceramic slurry are configured so that the weight percentage of the nano-particles will be a certain percentage even after combined with the ceramic slurry and the water is pulled off. In some embodiments, the nano-particle dispersion and the ceramic slurry are configures such that the ratio of the ceramic material 601 to the nano-particles 606 in the fully dried manufacture 200 is 99:1. In some embodiments, the nano-particles account for approximately 1% by weight of the nano-dispersion, while the ceramic particles account for approximately 35-50% by weight of the ceramic slurry.

In some embodiments, the nano-dispersion comprises a pH suitable for best mixing results with the ceramic slurry. The pH of the dispersion can be manipulated using additives. In an exemplary embodiment, the pH of the dispersion is slightly basic, as testing has shown that such a configuration provides the best mixing results. In some embodiments, the pH of the dispersion is 7.5. The slurry 923 comprises a pH suitable for best mixing results with the dispersion 922. In an exemplary embodiment, the pH of the slurry 923 comprises a base. In one embodiment, the base pH comprises an 8.0-9.0 pH. In another embodiment, the base pH comprises an 11.0 pH.

In some embodiments, various additives or binders that facilitate mixing, drying, and sintering can be added to the ceramic slurry before the slurry is combined and/or mixed with the nano-dispersion. In some embodiments, various additives or binders that facilitate mixing, drying, and sintering can be added to the ceramic slurry after the slurry is combined and/or mixed with the nano-dispersion.

At step 760, a drying process is performed on the dispersion/slurry mixture. In some embodiments, such as shown in step 960 of FIG. 9, a spray drying process is utilized to dry the nano-dispersion/slurry mixture 958. In some embodiments, the spray drying process comprises loading a spray gun 953 and spraying the nano-dispersion/slurry mixture into a container or a closed compartment (e.g., a glove box). The nano-dispersion/slurry mixture is sprayed within the compartment and then allowed to dry. As the drying proceeds, appreciable amounts of the liquid of the nano-dispersion/slurry mixture evaporate to result in a powdered form or a premanufacture. In some embodiments, the drying process comprises a freeze drying process. In some embodiments, freeze drying comprises placing the nano-dispersion/slurry mixture into a freeze dryer and allowing the liquid of the nano-dispersion/slurry mixture to evaporate until what results comprises a powdered form or premanufacture. In a preferred embodiment, the premanufacture comprises the nano-particles uniformly distributed throughout the ceramic material.

At step 770, the dried mixture, or powdered premanufacture, is formed into a mold, such as the mold 972 shown in step 970 of FIG. 9. The mold can be formed in the desired shape of the resulting tile. The mixture can then be pressed to form a molded or formed premanufacture. In some embodiments, the mixture is subjected to additional drying in order to facilitate the removal of any organic binders remaining in the formed dried mixture. In some embodiments, the molded premanufacture is dried using a low temperature furnace. In some embodiments, the molded premanufacture is dried using a convection drying oven.

At step 780, a bonding process is then performed on the formed dried mixture. In some embodiments, the bonding process comprises a sintering process involving some sort of sintering mechanism, such as furnace or oven 982 shown in step 980 of FIG. 9. The sintering process can comprise any of a variety of sintering processes. In some embodiments, the sintering process comprises a hot isostatic pressing (HIP) process. The hot isostatic pressing comprises placing the molded premanufacture into a HIP furnace where the molded premanufacture is heated under pressure. The HIP process facilitates a removal of porosity within the molded premanufacture. In some embodiments, a liquid phase sintering process is used. In some embodiments, a simple hot pressing process is used. In some embodiments, a pressureless sintering process is used. However, as evident by the above discussion regarding FIGS. 1-5B, it is preferable to use a spark plasma sintering process to achieve the most beneficial results.

As a result of the bonding process, a manufacture of tile is produced. Referring back to FIG. 6, a result of the method 700 comprises the tile 600 with improved fracture toughness in accordance with an embodiment of the present invention. The tile 600 comprises a composite of a ceramic material 601 and nano-particles or nano-material 606. A novel feature of the method 700 produces the tile 600 comprising the nano-particles 606 uniformly distributed throughout the ceramic material 601. This complete and uniform distribution of nano-particles throughout the tile or manufacture is achieved by the unique characteristics of the nano-dispersion and the novel method of combining and mixing the ceramic slurry with the nano-dispersion. By efficiently distributing the nano-particles 606 throughout the tile 600, the present invention significantly reduces crack propagation. When a crack propagates through a tile, it loses energy every step of the way along the tile, until it eventually stops. By placing the nano-particles in the ceramic tile, the crack eventually finds a nano-particle as it propagates through the tile. It then has to move around that nano-particle because it cannot go through it. It then runs into another nano-particle and has to move around that nano-particle. Every time the crack hits a nano-particle, it dissipates energy. Since there are so many nano-particles in the tile and they are so well dispersed throughout the tile, the nano-particles provide a very high surface area for the crack to hit. As a result, the crack energy dissipates very quickly and the length of the cracks is very short. A ceramic tile with the nano-particles dispersed throughout in accordance with the principles of the present invention is significantly more efficient than a standard ceramic tile.

This disclosure provides several embodiments of the present invention. It is contemplated that any features from any embodiment can be combined with any features from any other embodiment unless otherwise stated. In this fashion, hybrid configurations of the illustrated embodiments are well within the scope of the present invention.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made and equivalents may be substituted for elements in the embodiments chosen for illustration without departing from the spirit and scope of the invention as defined by the claims.

What is claimed is:

1. A method of making a sandwich of impact resistant material, the method comprising:
    providing a first tile comprising a plurality of nano-particles bonded together, wherein the nano-structure of the nano-particles is present in the first tile and the first tile comprises a hardness value;
    providing a second tile comprising a plurality of nano-particles bonded together, wherein the nano-structure of the nano-particles is present in the second tile and the second tile comprises a hardness value;
    providing a third tile comprising a plurality of nano-particles bonded together, wherein the nano-structure of the nano-particles is present in the third tile and the third tile comprises a hardness value; and
    coupling the second tile in between the first tile and the third tile, wherein the second tile comprises a hardness value greater than the first tile and third tile.

2. The method of claim 1, wherein:
the hardness value of the first tile is between 1000 and 1500 HV;
the hardness value of the second tile is between 2500 and 3500 HV; and
the hardness value of the third tile is between 1000 and 1500 HV.

3. The method of claim 1, wherein the nano-particles that form first tile and the third tile comprise silicon nitride nano-particles.

4. The method of claim 1, wherein the nano-particles that form the second tile comprise tungsten carbide nano-particles, tantalum carbide nano-particles, or titanium carbide nano-particles.

5. The method of claim 1, wherein the nano-particles of the first tile, the second tile, and the third tile comprise an average grain size of 1 to 10 nanometers.

6. The method of claim 1, wherein the nano-particles of the first tile, the second tile, and the third tile comprise an average grain size of 10 to 50 nanometers.

7. The method of claim 1, wherein the nano-particles of the first tile, the second tile, and the third tile comprise an average grain size of 50 to 100 nanometers.

8. The method of claim 1, wherein the nano-particles of the first tile, the second tile, and the third tile comprise an average grain size of 100 to 250 nanometers.

9. The method of claim 1, wherein the nano-particles of the first tile, the second tile, and the third tile comprise an average grain size of 250 to 500 nanometers.

10. The method of claim 1, wherein the second tile is coupled between the first tile and the third tile via adhesive layers.

11. The method of claim 1, wherein coupling the second tile in between the first tile and the third tile comprises performing a spark plasma sintering process on the nano-particles of the first tile, the second tile, and the third tile.

12. The method of claim 1, further comprising a ductile backing layer coupled to the third tile on a side opposite the second tile.

13. The method of claim 12, wherein the ductile backing layer comprises an adhesive layer.

14. The method of claim 12, wherein the ductile backing layer comprises:
a layer of polyethylene fibers; and
an adhesive material.

* * * * *